(12) United States Patent
Taniguchi et al.

(10) Patent No.: US 6,612,021 B1
(45) Date of Patent: Sep. 2, 2003

(54) APPARATUS FOR A WIRE MOUNT CONTROL

(75) Inventors: Yoshikazu Taniguchi, Yokkaichi (JP); Satoru Taniguchi, Kanazawa (JP); Kenji Chiyoda, Yokkaichi (JP); Hajime Kato, Yokkaichi (JP)

(73) Assignee: Sumitomo Wiring Systems, Ltd. (JP)

(\*) Notice: Subject to any disclaimer, the term of this patent is extended or adjusted under 35 U.S.C. 154(b) by 241 days.

(21) Appl. No.: 09/628,057

(22) Filed: Jul. 28, 2000

(30) Foreign Application Priority Data

Jul. 28, 1999 (JP) .......................... 11-213647
Jul. 28, 1999 (JP) .......................... 11-213648

(51) Int. Cl.$^7$ .............................................. H01K 3/22
(52) U.S. Cl. ........................... 29/748; 29/712; 29/857; 324/522; 324/538; 324/713; 324/758
(58) Field of Search ............................... 29/33 M, 33 F, 29/754, 745, 755, 712, 709, 747, 748, 593, 868, 710, 720, 714, 721, 702; 324/512, 522, 538, 713, 754, 758, 761

(56) References Cited

U.S. PATENT DOCUMENTS 3,705,347 A * 12/1972 Tuller .......................... 324/66
4,859,953 A * 8/1989 Young et al. .................. 324/539
4,951,385 A * 8/1990 DeSanto ........................ 29/754
5,410,115 A 4/1995 Hizume et al. ............. 200/61.62
5,612,680 A * 3/1997 DeSanto ........................ 29/755
5,623,199 A 4/1997 Taniguchi et al. ............. 324/66
5,682,672 A 11/1997 Taniguchi et al. ............. 29/748

FOREIGN PATENT DOCUMENTS

| EP | 0 303 235 | 2/1989 |
|---|---|---|
| EP | 0 901 204 | 3/1999 |
| JP | 8-96922 | 4/1996 |
| JP | 11-329656 | 11/1999 |

\* cited by examiner

Primary Examiner—Peter Vo
Assistant Examiner—Donghai Nguyen
(74) Attorney, Agent, or Firm—Gerald E. Hespos; Anthony J. Casella

(57) ABSTRACT

A wire control apparatus is provided for controlling the mounting of the ends of wires to connectors as part of a wiring harness assembling procedure. The apparatus includes supplies of wires and instructing indicators to identify which wire should be selected by an operator. The apparatus also include jigs for receiving the connectors. The apparatus then provides indicators for issuing instructions to identify the connectors to which the respective wires are to be connected and probes for testing that the wires have been connected pursuant to the instructions.

11 Claims, 17 Drawing Sheets

APPARATUS FOR A WIRE MOUNT CONTROL

BACKGROUND OF THE INVENTION

1. Field of the Invention

The present invention relates to a wire mount control apparatus for controlling the mount positions of wires relative to insertion holes in a connector. The invention also relates to electrical connections between the ends of the wires. Furthermore, the invention relates to a wire mount control method, a probe and a wire insertion detection jig.

2. Description of the Related Art

FIG. 18 shows a first prior art wire mount instructing/testing apparatus. This apparatus is used for mounting the leading ends of wires in one connector during the manufacture of a wiring harness or during the manufacture of a subassembly of a wiring harness. The prior art apparatus of FIG. 18 substantially simultaneously instructs, guides and tests proper insertion of the respective wires into the connector.

Wires are mounted with the prior art apparatus of FIG. 18 by first placing the connector (not shown) with which wires are to be connected in a connector receptacle 6. Terminals for external connection are mounted in advance at ends of the wires that are to be connected with this connector, and the respective wires are accommodated in wire accommodating portions 3 that correspond to different kinds of the wires.

Next, a selected one of several instructing LEDs 2 is blinked pursuant to a command from a control unit 1 and in accordance with a program of the control unit 1. The operator then takes a wire from a wire-accommodating portion 3 that corresponds to the blinking instructing LED 2.

A selected one of a plurality of illuminating LEDs (not shown) in the control unit 1 then is turned on, and light emitted from the LED is guided to an end 4 of an optical fiber 5 to illuminate one of the insertion holes of the connector (not shown) in the connector receptacle 6. The operator inserts the leading end of the wire that was taken from the wire-accommodating portion 3 into the illuminated insertion hole of the connector for connection.

The leading end of the wire reflects light from the optical fiber 5 as the end of the wire is inserted into the insertion hole of the connector. This reflected light then is guided back through the optical fiber 5 to a light detector (not shown) in the control unit 1. The light detector determines whether the terminal has been inserted properly based on the signal of the light detector. If the terminal has been inserted properly, a success buzzer (not shown) in the control unit 1 rings, and the blinking instructing LED 2 is turned off.

After the first wire has been mounted in the connector and the test has been completed, a next wire to be taken out is identified by blinking the corresponding instructing LED 2. The insertion hole of the connector into which this next wire is to be inserted is illuminated by the optical fiber 5, and whether the wire has been properly inserted is detected based on the presence or absence of the reflected light guided through the optical fiber 5. Hereafter, the mounting of the wires in the connector and the tests are performed successively in a similar manner.

The prior art apparatus of FIG. 18 enables more than one step to be performed simultaneously. For example, the wire to be taken is identified by blinking the corresponding instructing LED 2. Simultaneously, the insertion hole of the connector into which the taken wire is to be inserted is illuminated by the optical fiber 5. At almost the same time, a determination of whether the wire has been properly inserted can be detected based on the presence or absence of the reflected light guided through the optical fiber 5. Thus, the insertion of the terminal and the test on the inserted state can be performed simultaneously.

FIG. 19 shows a second prior art wire mount instructing/testing apparatus. This apparatus is used when a first end of each of a plurality of wires 11 already has been mounted in a first connector 12. The second ends of the respective wires 11 then must be mounted in proper positions of a second connector 13. The prior art apparatus of FIG. 19 substantially simultaneously instructs, guides and tests proper insertion of the respective wires 11 into the second connector 13.

Wires are mounted in the second connector 13 using the apparatus of FIG. 19 by first applying a specific voltage from a circuit in a control unit 14 to all terminals of the first connector 12 in which the wires 11 are mounted. The voltage is applied via a flexible printed-wiring strip 15 and specified electrodes (not shown) in a first connector receptacle 16.

An operator then selects a desired wire 11A from the plurality of wires 11 mounted in the first connector 12, and brings a terminal 17A at the second end of that wire 11A into contact with a ground plate 18. The ground plate 18 is grounded via the flexible printed-wiring strip 15 and a circuit in the control unit 14. Accordingly, a voltage level of the terminal in the first connector receptacle 16 that is connected with the first end of the wire 11A changes to LOW when the terminal 17A contacts the ground plate 18. This change enables a circuit in the control unit 14 to identify the wire 11A selected by the operator. A circuit in the control unit 14 then selects one of a plurality of illuminating LEDs 19 and applies a drive current to the illuminating LED 19 via the flexible printed-wiring strip 15 to turn on the illuminating LED 19.

A second connector receptacle 20 in which the second connector 13 is mounted is provided near the illuminating LEDs 19. Thus the insertion positions of the respective wires 11 in the second connector 13 and the corresponding illuminating LEDs 19 are located adjacent to each other when the second connector 13 is mounted in the second connector receptacle 20. Accordingly, the operator mounts the terminal 17A into the corresponding insertion position of the second connector 13 adjacent to the illuminated LED 19. At this time, the terminal 17A is connected with a specified connector terminal (not shown) in the second connector 13, which has been connected with the second connector receptacle 20.

The respective unillustrated electrodes of the second connector receptacle 20 are connected with the terminal 17A at the second end of the wire 11A via the specified connector terminals in the second connector 13. Voltage is applied to the respective electrodes of the second connector receptacle 20, and the applied voltage is outputted to the specified circuit in the control unit 14 via the flexible printed-wiring strip 15. Accordingly, the voltage is applied from the control unit 14 to the first end of the wire 11A via the flexible printed-wiring strip 15 and the electrodes in the first connector receptacle 16. Electrical connections between the respective electrodes in the first connector receptacle 16 and those in the second connector receptacle 20 can be tested by inputting the voltage from the terminal 17A at the second end of the wire 11A to the control unit 14 via the connector terminals in the second connector 13, the electrodes of the second connector receptacle 20 and the flexible printed-wiring strip 15. As a result, whether or not the wire 11A is mounted in the proper mount position of the connector can be detected.

Other wires 11 mounted in the first connector 12 can have the second ends properly mounted in the second connector in a similar manner.

Pedal switches 7 and 23 in FIGS. 18 and 19, respectively, are provided to switch to a manual operation so that the operator can manually input an actual operation relating to the wire insertion and guide and register a product number of the wires.

In the FIG. 18 prior art, the wire mount position is identified and the mounting of the wire is tested for the first end (hereinafter, "A-end") of the wire to be connected with the connector. On the contrary, in the FIG. 19 prior art, the proper wire mount position is identified and the mounting of the wire is tested for the second end (hereinafter, "B-end") of a wire that has its first end already connected with the connector.

The above-described operations desirably should be performed by a flow production. However, FIGS. 18 and 19 represent entirely separate prior art wire mount instructing/testing apparatuses, and it is difficult to perform the above operations by a flow production at the same operation site. Thus, an assembly of a first connector and the respective wires that was assembled and tested in the prior art apparatus of FIG. 18 has to be transferred to the prior art apparatus of FIG. 19 to have the second ends of the respective wires connected with the second connector. Such a combination of the operations impedes optimal operation efficiency.

Certain of the above-described elements could be used commonly in the prior art apparatuses of both FIGS. 18 and 19. For instance, it is possible: to provide the control unit 1 shown in FIG. 18 with the function of the control unit 14 shown in FIG. 19; to switch the functions by specifically switching a mode; to commonly use the connector receptacle 6 shown in FIG. 18 and the connector receptacles 16, 20 shown in FIG. 19; and to commonly use the pedal switches 7, 23. However, even such a rearrangement would not improve time efficiency significantly because the operations of the first and second prior art apparatuses need to be performed in a time sequence.

The aforementioned first and second prior art devices test whether the ends of the wires have been mounted in proper mount positions by inserting the ends of the wires into the respective cavities of the connectors and detecting electrical connections between the wires and the connectors. These tests are conducted after connecting the connectors 12 and 13 of FIG. 19 with the connector receptacles 6, 16 and 21. However, the connector receptacles 6, 16, 20 that are compatible with the actual respective connectors actually are used one by one. Thus, the connector receptacles 6, 16 and 20 have to be changed when the product number of the subassembly is changed, which presents poor efficiency. In view of this, it is desirable to use a wire insertion-detecting jig having which can accommodate product numbers of all subassemblies.

In the case of wire insertion detecting jigs having a good efficiency, wirings for the connection between the wire insertion detecting jigs and the control units 1, 14 increase in proportion to the maximum number of the wires to be assembled since these detecting jigs need to accommodate the assembling of many wires. As a result, a large space is required for the wirings for connection, which presents a difficulty in wiring layout. Particularly, in the case of the second prior art relating to the mounting of the B-ends, it is necessary to consider not only detection of mounting of the wires, but also a wiring for the ground plate 18. Therefore, there is a demand for an improvement in wiring efficiency.

An object of the present invention is to provide a wire mount control apparatus and method as well as a probe and wire insertion detecting jig that allow efficient control and that identify mount positions in connectors for the opposite ends of wires of a wiring harness and that preferably test the mounting of the wires at a single operation site.

SUMMARY OF THE INVENTION

The subject invention is directed to a probe for detecting contact by an end of a wire. The probe comprises a conductive hollow barrel, which at least partly forms an outer periphery of the probe and which is connected or connectable with a specified common conductor. The probe also comprises a contact inside the barrel. The contact bulges or projects out sufficiently to connect electrically with the barrel. At least one electrically insulating element is fit in the barrel, and at least one conductive bar is fit loosely in the electrically insulating element for movement toward and away from the contact. The probe further comprises a biasing member for urging the conductive bar against the contact. However, the end of the wire can be inserted into the barrel to urge the conductive bar away from the contact.

A plurality of the above-described probes may used with a wire mount control apparatus and may be loosely inserted into each of a plurality of accommodating portions of a jig main body. Each accommodating portion may be configured to receive a connector that has a plurality of cavities into which wire ends may be inserted. The above-described probes can be fit loosely into each of a plurality of through holes formed in a base plate and then into an accommodating portion of the jig main body. The probes then may project into the cavities of a connector that is inserted into the respective accommodating portion for detecting contact by an end of a specified wire. The common conductor to which the barrel of the probe is connected may be formed in the jig main body.

Accordingly, the conductive bars are held in contact with the contact elements by the biasing forces of the biasing means to connect the conductive bars of all probes to the common conductor via the barrels. On the other hand, when an end of a wire is inserted into the connector sufficiently to contact any one of the probes, the corresponding conductive bar is moved away from the contact element against the biasing force of the biasing means to electrically disconnect the bar member of the probe from the common conductor. Accordingly, the presence of the-wire in the connector can be detected easily merely by detecting the potential of the conductive bar of the probe. More particularly, the barrels that define the peripheries of the probes are adhered to the common conductor at the through holes of the base plate. Thus, the barrels and the contact elements of all probes can be maintained at a specified potential merely by using the single lead wire extending from this common conductor. Accordingly, it is sufficient to use only a single lead wire for the potentials of the contact elements of all the probes even if many probes are required to accommodate the many cavities or insertion holes of the connector. Thus, a wiring efficiency can be improved significantly as compared to a case where wiring is provided for the contact element of each probe. Therefore, the probes can be arranged more densely in the wire insertion-detecting jig.

Preferably, the conductive bar is comprised of two conductive bar elements. The first conductive bar element is disengaged from the contact element by the contact of the end of the wire with the second bar element. The first and second bar elements then can be brought to a potential different from the potential of the contact element.

The invention further is directed to the above-described wire insertion-detecting jig as used with a wire mount control apparatus. The wire mount control apparatus is operable for detecting whether or not ends of wires have been inserted into insertion holes of a connector that is accommodated at least partly accommodated in the jig. The wire insertion-detecting jig may comprise locking members for locking the connectors in the accommodating portions.

The wire insertion-detection jig may comprise a touch plate on the jig main body for electrical connection with the common conductor. Thus, when an operator brings an arbitrary wire into contact with the touch plate, the potential of the wire is switched to the same potential as the common conductor. Accordingly, it is sufficient to connect the touch plate with the common conductor to hold the potential of the contact elements of all probes at the specified level, and a control unit then can recognize an arbitrary wire that has been brought into contact with the touch plate. Thus, the number of wirings needs not be increased as much as where special wirings are provided.

The invention also is directed to a wire mount control apparatus for controlling the mounting or assembling of wires in a desired connector. The connector is formed with a plurality of insertion holes. The wire mount control apparatus comprises a plurality of wire supplying means for supplying various wires. The wire mount control apparatus also includes instructing indicators that may be provided in a one-on-one correspondence with the plurality of wire supplying means. The instructing indicators identify one wire supplying means for supplying a wire to be taken or grasped by an operator. A plurality of wire insertion-detecting jigs is provided for at least partly accommodating connectors that are to be connected with specified wires and for detecting whether or not the respective wires have been inserted into the plurality of insertion holes of the connectors. The wire mount control apparatus further comprises a control means for electrically controlling the instructing indicators and the wire insertion-detecting jig.

Each wire insertion-detecting jig of the wire mount control apparatus comprises a jig main body formed with an accommodation portion into which the connector is at least partly mountable. Each jig further comprises at least one probe as described above. The probes are provided in the accommodation portion of the jig main body to correspond substantially to the respective insertion holes of the connector. Additionally, each probe is held at a specified first potential when an end of the wire is not inserted in the corresponding insertion hole, while having its potential switched to a second potential different from the first potential when the end of the wire is inserted into the corresponding insertion hole and into contact with the probe. Guiding indicators are provided, preferably in one-on-one correspondence with the probes, for indicating the insertion hole of the connector into which the operator should mount the wire.

The control means of the wire mount control apparatus comprises a first indicating section for identifying a wire supplying means that supplies the wire the operator should take. The first indicating section controls a corresponding one of the instructing indicators for each of the wires in accordance with an assembling order that is based on information previously registered in a storage means. A guiding indicator is controlled to identify a proper insertion hole of a first connector in which the operator should mount the first end of the wire. A second indicating section is operative to detect the wire chosen by the operator. The second indicating section indicates a proper single insertion hole of the second connector in which the operator should mount the second end of each wire by controlling the guiding indicator corresponding to the proper insertion hole based on the detection result and information previously registered in the storage means.

The wire insertion detection jig may comprise a touch plate held at a first potential and exposed on the outer surface of the jig main body. Thus the operator can intentionally bring the end of the wire into contact with the touch plate. The second indicating section detects the wire chosen by the operator by the contact between the second end of the chosen wire and the touch plate. The detection is based on a change in the voltage level of the probe in contact with the first end of each wire from the second potential to the first potential when the operator brings the second end of the wire into contact with the touch plate held at the first potential.

The first instructing section may be provided for judging that the first end of each wire has been mounted properly when the voltage level of the probe located at the mount position is switched from the first potential to the second potential.

The second instructing section also may be provided for judging that the second end of each wire has been mounted properly when the voltage level of the probe at the mount position is switched from the first potential to the second potential.

The control means may further comprise an electrical connection testing section for testing an electrical connection between the first and second connectors by detecting potential changes in the probes of the first and second wire insertion-detecting jigs. The detection may be achieved by successively switching the potentials of the respective probes in either the first or second wire insertion detecting jig from the first potential to the second potential, preferably after the indication and/or the judgment are completed for all wires in the first and second indicating sections.

Each wire insertion-detecting jig of the wire mount instructing/testing apparatus comprises a jig main body formed with an opening into which the connector is mounted. Probes are provided at the bottom of the opening of the jig main body and correspond to the respective insertion holes of the connector. The probes are held at a specified first potential when an end of the wire is not inserted in the corresponding insertion hole, but have the potential switched to a second potential different from the first potential when the end of the wire is inserted into the corresponding hole to contact the probe. Guiding lamps are provided in one-on-one correspondence with the probes for guiding the insertion hole of the connector into the opening into which the operator should mount the wire. A touch plate is exposed on the outer surface of the jig main body and is held at the first potential. Thus, the operator can intentionally bring the end of the wire into contact with the touch plate.

The control means of the apparatus comprises a first instructing/guiding section for identifying the supplying channel that accommodates the wire the operator should take out. The identification is achieved by turning on a corresponding one of the instructing lamps for each of the wires in accordance with an assembling order based on specified information registered in advance in a specified storage means. The control means also identifies a proper single insertion hole of the connector in which the operator should mount the first end of each wire by turning on the guiding lamp that corresponds to the proper insertion hole. The control means further judges that the first end of each wire has been properly mounted when the voltage level of the probe located at the mount position is switched from the first potential to the second potential.

A second instructing/guiding section is provided in the control means for detecting the contact of the second end of each wire with the touch plate. The detection is based on a change in the voltage level of the probe in contact with the first end of each wire from the second potential to the first potential, and occurs when the operator brings the second end of each wire into contact with the touch plate held at the first potential. The control also is achieved by turning on a guiding lamp to identify a proper single insertion hole of the second connector in which the operator should mount the second end of each wire. The particular lamp turned on is based on the detection result and information previously registered in the storage means. The control means judges that the second end of each wire has been properly mounted when the voltage level of the probe at the mount position is switched from the first potential to the second potential.

The apparatus also has an electrical connection testing section for testing an electrical connection between the first and second connectors by detecting potential changes in the probes of the first and second wire insertion-detecting jigs. The testing may be achieved by successively switching the potentials of the probes in either the first or second wire insertion detecting jigs from the first potential to the second potential after the guiding and the judgment are completed for all the wires in the first and second instructing/guiding sections. Accordingly, the operator can recognize the connection of the wires efficiently and, if he tries to insert the wire in a mistaken manner, the control means can immediately detect it.

The process of mounting the second ends of the wires into the second connector is started when the operator brings the second end of any wire into contact with the touch plate at an arbitrary timing. Thus, a process can be performed in any operation sequence. For example, in the case of assembling a plurality of wires, all the second ends of the wires may be mounted in the second connector after the first ends thereof are mounted in the first connector. Alternatively, the wires may be mounted one by one such as in a case where the opposite ends of a next wire may be connected with two connectors after those of a first wire are connected with the two connectors. This provides an advantage that the operator can conduct an actual assembling operation in accordance with the operation sequence he freely selects. Further, the electrical connection tests for all the wires can be conducted after all the wires are mounted. Therefore, operation efficiency can be improved significantly compared with the conventional practice with which the first ends and the second ends of the wires are mounted into the respective connectors by separate apparatuses.

Preferably, the apparatus further comprises a sound output means for notifying a success in tests by a specified sound. Thus, a sound would be generated if the first instructing/guiding or indicating section judges that the first end of each wire has been mounted properly, if the second instructing/guiding or indicating section judges that the second end of each wire has been mounted properly and/or if the electrical connection testing section detects the proper electrical connection based on information in the storage means. The sound output means also may notify of a failure in tests by a specified sound if the first instructing/guiding or indicating section judges that the first end of any wire has been mounted improperly, if the second instructing/guiding or indicating section judges that the second end of any wire has been mounted improperly and/or if the electrical connection testing section does not detect the proper electrical connection based on the information in the storage means. Accordingly, a success or failure in mounting the wires can easily be notified to the operator by sounds.

The apparatus may further comprise a combination selecting/designating means for selecting and designating one of a plurality of combinations of the wire mount positions for each connector. Additionally, the controller may further comprise a data-registering unit for registering data on the plurality of combinations of the wire mount positions for each connector. Accordingly, the operator can mount the wires in accordance with various specifications using the same wire mount instructing/testing apparatus by registering a plurality of specifications beforehand.

The control means preferably identifies the wire supplying means from which the operator should take the wire by controlling or activating or changing a state of the supply means, preferably by blinking one of the instructing indicators or lamps based on the information in the storage means if the operation of the first instructing/guiding or indicating section starts with none of the probes of the wire insertion detecting jigs contacted by the wire. The control means controls or activates or changes a state of the supply means, and preferably turns on all the instructing indicators or lamps corresponding to all the wire supplying means or supplying channels that supply or accommodate the wires to be mounted into the one connector based on the selected and designated content of the selecting/designating means and/or the information in the storage means.

Accordingly, the instructing indicator or lamp that corresponds to the wire to be connected with the one connector is blinked and the one corresponding to the wire to be connected next with this connector preferably is turned on. This operation is convenient because the operator can easily know succeeding operations.

According to a further preferred embodiment, the second instructing/guiding or indicating section of the control means judges that the second end of each wire has been mounted properly when the voltage level of the probe located at the correct single insertion hole of the second connector is switched from the first potential to the second potential without the second end of each wire being brought into contact with the touch plate by the operator. Accordingly, the operator can save labor to illuminate the guiding lamps by bringing the second end of each wire into contact with the touch plate, for example, in the case of repeatedly forming subassemblies of the same specification, with the result that operation efficiency can be improved.

Preferably, the control means is formed with at least one success output terminal for outputting a success signal if all the wires have been properly mounted in the connectors accommodated in the first and second wire insertion detecting jigs. The control means preferably is constructed to receive a success signal sent from a success output terminal of another wire mount instructing/testing or control apparatus and, in such a case, outputs the success signal from the success output terminal thereof only when all the wires relating to this control means have been properly mounted and the success signal is inputted from the other wire mount instructing/testing or control apparatus.

Accordingly, by connecting a plurality of wire mount instructing/testing or control apparatuses using the success output terminals, the connection of the number of wires, which cannot be handled by one wire mount instructing/ testing or control apparatus, can be guided and tested using the plurality of wire mount instructing/testing or control apparatuses.

Most preferably, the control means comprises switching means for setting a data registration mode for registering or storing or detecting an assembling order of the respective wires and a correspondence between first and second ends of the respective wires based on a specified operation of the operator. The control means further comprise registering means, which function with the data registration mode set, for registering sequences of the controlled or activated or turned-on state or blinking state of the respective instructing indicators or lamps and/or the respective guiding indicators or lamps. The registering means may further register a sequence of bringing the first ends of the plurality wires into contact with the respective probes when the operator brings the first ends of the respective wires into contact with the respective probes in the first wire insertion detecting jig in a sequence employed in an actual operation while corresponding the controlling or activating or turning-on or blinking of the respective instructing lamps or indicators and/or the respective guiding lamps or indicators. The control means may further comprise extracting means, which function when connectors of a specified model harness completed beforehand by mounting opposite ends of wires in connectors are mounted in the respective wire insertion detecting jigs with the data registration mode set, for extracting a correspondence in connection of the opposite ends of the respective wires mounted in the connectors and saving it in the storage means.

Accordingly, the correct operation confirming to an actual operation is registered as data by the operator bringing the first ends of a plurality of wires into contact with the respective probes in one wire insertion detecting jig in an operation sequence employed by the actual operation with the data registration mode set. Accordingly, the data can be registered by a very simple method, and anybody can easily carry out data registration. Further, since the operation procedure during the data registration is the same as the one employed during the actual operation (of instructing and guiding insertion), there is an advantage that the operator can easily recognize the operation procedure at the same time he carries out the data registration.

The connectors of the specified model harness are completed beforehand such that opposite ends of the wires are mounted in the respective connectors, which, in turn, are mounted into the respective wire insertion detecting jigs. Consequently, a correspondence in connection between the opposite ends of the respective wires mounted in the connectors is extracted and registered in the storage means. Thus, data can be registered automatically merely by mounting the connectors of the model harness prepared beforehand into the wire insertion detecting jigs. Therefore, data registration can be carried out by a very easy operation.

The invention also is directed a wire mount control method for controlling the mounting of wires in a desired connector formed with a plurality of insertion holes. The method comprises accommodating various wires to be supplied in a plurality of wire supplying means. The method proceeds by providing instructing indicators, preferably in one-on-one correspondence with the plurality of wire supplying means, for identifying one supplying channel that accommodates a wire to be taken by an operator. The method continues by providing guiding indicators, preferably in one-on-one correspondence with the probes, for indicating the insertion hole of the connector into which the operator should mount the wire. The method further comprises at least partly accommodating desired connectors to be connected with specified wires in a plurality of wire insertion-detecting jigs. The wire insertion detecting jigs are suitable to detect whether or not the respective wires have been inserted into the plurality of insertion holes of the connectors. Thus, when a wire is not inserted into the respective insertion hole of the connector, a probe provided in a position in the wire insertion-detecting jig corresponding to the insertion hole is held at a specified first potential while having its potential switched to a second potential different from the first potential when the end of the wire is inserted into the corresponding hole to contact the probe. The method then comprises electrically controlling the instructing indicators and the wire insertion detecting jigs by a control means. The method may further proceed by indicating, by means of a first indicating section, one wire supplying means for supplying the wire that the operator should take. The indicating may be carried out by controlling a corresponding one of the instructing indicators for each of the wires in accordance with an assembling order based on specified information registered in advance in a specified storage means, and indicating a proper insertion hole of the connector in which the operator should mount the end of each wire by controlling the guiding indicator corresponding to the proper insertion hole. The method then continues detecting, by means of a second indicating section, a wire chosen by the operator to mount the second end of each wire in another connector accommodated in another wire insertion detecting jig with the one end of each wire mounted in one connector accommodated in the one wire insertion detecting jig. Finally, the method comprises indicating a proper insertion hole of the second connector in which the operator should mount the second end of each wire by controlling the guiding indicator corresponding to the proper insertion hole based on the detection result of the second indicating section and a specified information registered in advance in the specified storage means.

These and other objects, features and advantages of the present invention will become apparent upon a reading of the following detailed description and accompanying drawings.

DETAILED DESCRIPTION OF THE PREFERRED EMBODIMENTS

Figure 1:
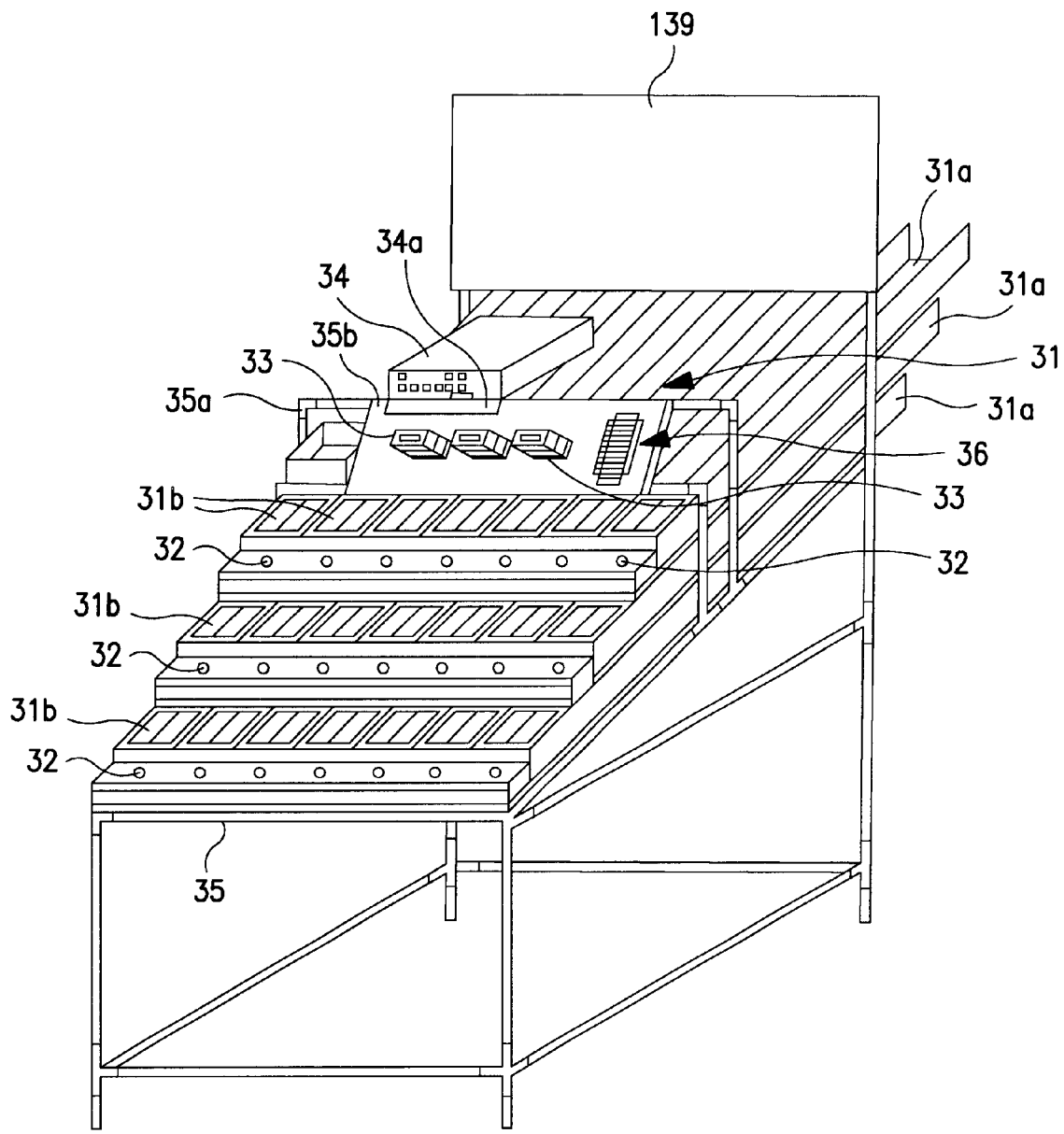
FIG. 1 is a perspective view showing the external configuration of a wire mount instructing/testing apparatus according to one embodiment of the invention.

A wire mount instructing/testing apparatus in accordance with the invention is illustrated in FIG. 1. The apparatus of FIG. 1 is used during the manufacture of a wiring harness subassembly, and instructs, guides, tests or otherwise controls the positioning of both ends of each wire of the subassembly into corresponding connectors. The apparatus also enables the detection of an electrical connection between the opposite ends of each wire in a wiring harness as part of the manufacturing process of a wiring harness subassembly.

As shown in FIG. 1, the apparatus comprises: a wire supplying unit 31; instructing LEDs 32, which may also be lamps, indicators, displays or panels; wire insertion detecting jigs 33; a control unit 34; and a product number switching board 36, all of which are placed on a work table 35.

The wire-supplying unit 31 includes a plurality of substantially parallel supplying channels 31a, which are placed at least partly above or transversely next to each other for separately accommodating a plurality of different kinds of wires. The wires extend substantially in a longitudinal direction of the channels 31a or from the back side to the front side in FIG. 1. The illustrated supplying channels 31a are merely one form of several optional wire supply means that may be incorporated into the apparatus. Other wire supplying means may comprise racks or holders for holding or supplying wires that are to be taken or grasped by the operator.

The instructing LEDs 32 preferably are provided in one-on-one correspondence with the supplying channels 31a. Alternatively or additionally one instructing means or indicator may be provided for two or more supplying channels 31a and may have different colors and/or shapes for identifying a specific supplying channel 31a.

Figure 4:
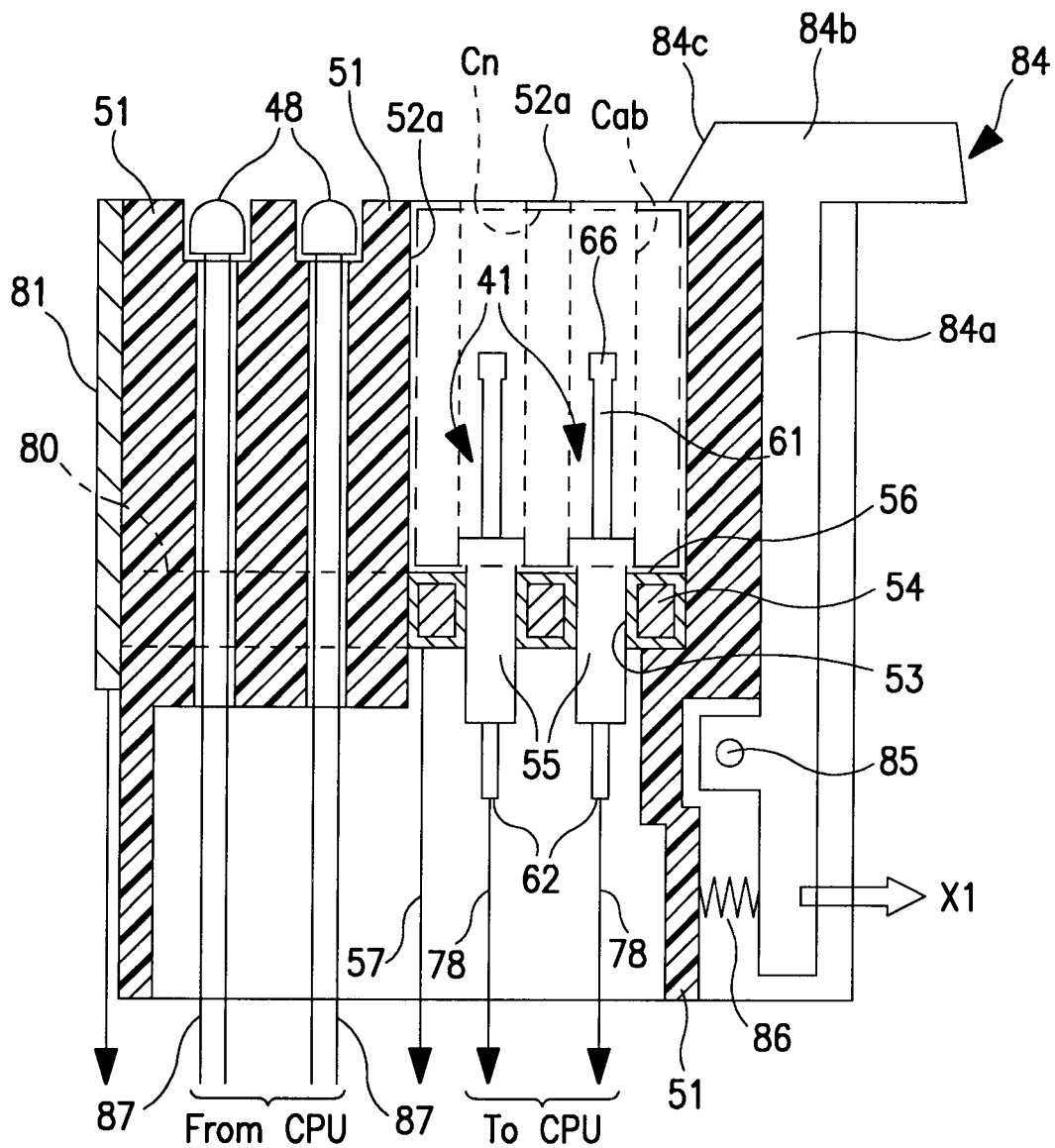
FIG. 4 is a section of the wire insertion-detecting jig used in the wire mount instructing/testing apparatus.

A connector Cn is placed in each detecting jig 33, as shown in FIG. 4, and detects whether the respective wires have been mounted properly into insertion holes Cab of the connector Cn. The control unit 34 electrically controls the elements 31, 32 and 33, and the switching board 36 enables a product number of the subassembly to be switched by actuating a switch.

The supplying channels 31a of the wire-supplying unit 31 are inclined downwardly toward their front sides, which is a dispensing side. Thus, wires placed at the back sides of the respective supplying channels 31a slide down to end walls at the front side. The leading ends of the wires that contact the end walls can be taken out through discharge openings 31b in the upper surfaces of the supplying channels 31a. The instructing LEDs 32 are in one-on-one correspondence with the upper openings 31b and are provided near the respective upper openings 31b.

The apparatus is constructed to detect whether the wires are mounted in the respective cavities (Cab in FIG. 4) of the connector Cn that has placed in the wire insertion-detecting jig 33. This detection is achieved with probes in the wire insertion-detection jig 33. More particularly, voltage levels, currents or signals of the probes are inputted to the control unit 34 and changes in such voltage levels are fed to a CPU 43 via a detection signal input/output circuit 42 in the control unit 34. The CPU 43 in the control unit 34 drives guiding LEDs, displays or indicators that are provided at the wire insertion detecting jigs 33, the instructing LEDs 32 that correspond to the respective supplying channels 31a and a buzzer (sound output means) 49 provided in the control unit 34 by controlling various driving circuits 44, 45, 46.

Figure 3:
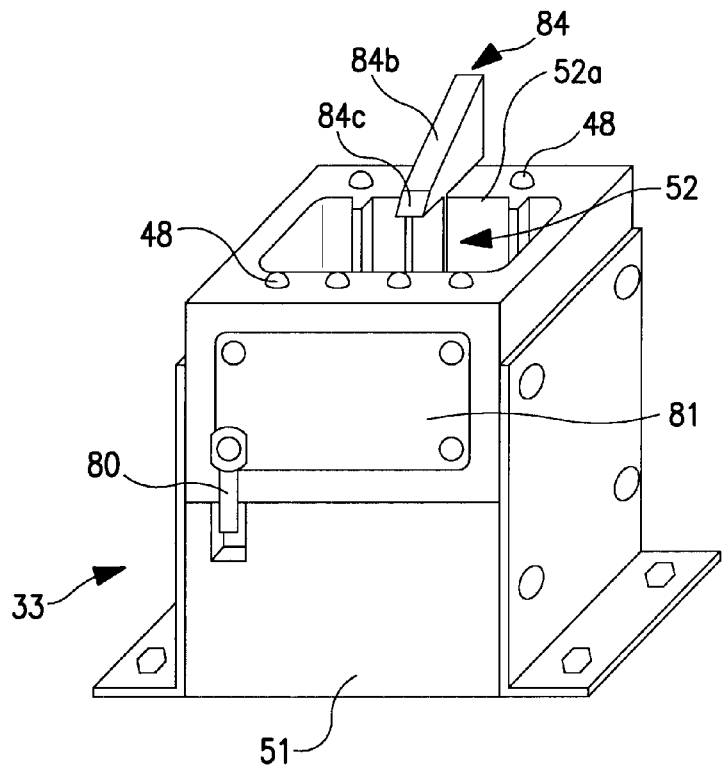
FIG. 3 is a perspective view of a wire insertion-detecting jig used in the wire mount instructing/testing apparatus.

Examples of wire insertion-detecting jigs 33 are shown in FIGS. 3 and 4. The jig 33 of FIG. 3 has the guiding LEDs 48 aligned in a line around an opening 52a of an accommodation portion 52 that at least partly accommodates a connector Cn. The jig 33 of FIG. 4, on the other hand, has two lines of the guiding LEDs 48 arranged at the left side of the opening. The jig can have other optional layouts. However, the guiding LEDs 48 should be provided in easily understandable correspondence with the probes 41 in the opening 52a.

A plurality of wire insertion detecting jigs 33 are provided on a fixed plate 35b disposed above the wire supplying units 31, as shown in FIG. 1. The plate 35b is mounted to a frame 35a that is secured to the worktable 35. The plurality of wire insertion detecting jigs 33 are provided because, after the first ends of wires are connected with a first connector Cn (see FIG. 4) mounted in a first wire insertion-detecting jig 33, the second ends are connected with a second connector Cn (see FIG. 4) mounted in a second wire insertion detecting jig 33. In some situations, the first ends of two wires may be connected with the same first connector, but the second ends of the two wires may be connected to two separate second connectors, i.e. the wires may require three (different) connectors. Hence, it is desirable to provide three wire insertion-detecting jigs 33 on the fixed plate 35b in view of such a possibility.

Each wire insertion-detecting jig 33 includes a jig main body 51. The accommodating portion 52 is formed in the upper surface of the jig main body 51 and is dimensioned for at least partly accommodating the connector Cn, as shown in FIGS. 3 and 4. A base plate 54 is secured to the bottom of the opening 52a defined by the accommodating portion 52 and is formed with through holes 53. Probes 41 are fitted in the through holes 53, as shown in FIG. 4. The probes 41 substantially correspond to positions of the respective cavities Cab of the connector Cn. Thus, when a wire is mounted into any one of the cavities Cab of the connector Cn, the leading end of the wire comes into contact with the leading end head 66 of the probe 41. A plating 56 of tin or other metal with excellent conductivity is applied to the entire upper and lower surfaces of the base plate 54 and to the entire inner surfaces of the through holes 53 of the base plate 54 where the probes 41 are fitted. Thus, the metal plating 56 can be held in close contact with conductive barrels 55 at the outer peripheries of the probes 41. The metal plating 56 is grounded via a ground lead wire 57. Thus, the barrels 55 of the probes 41 are held constantly at ground potential. More particularly, the metal plating 56 is connected with all the probes 41 and is grounded via one ground lead wire 57, so that the barrels 55 of all the probes 41 can be held at ground potential by using only the single ground lead wire 57.

Figure 5A:
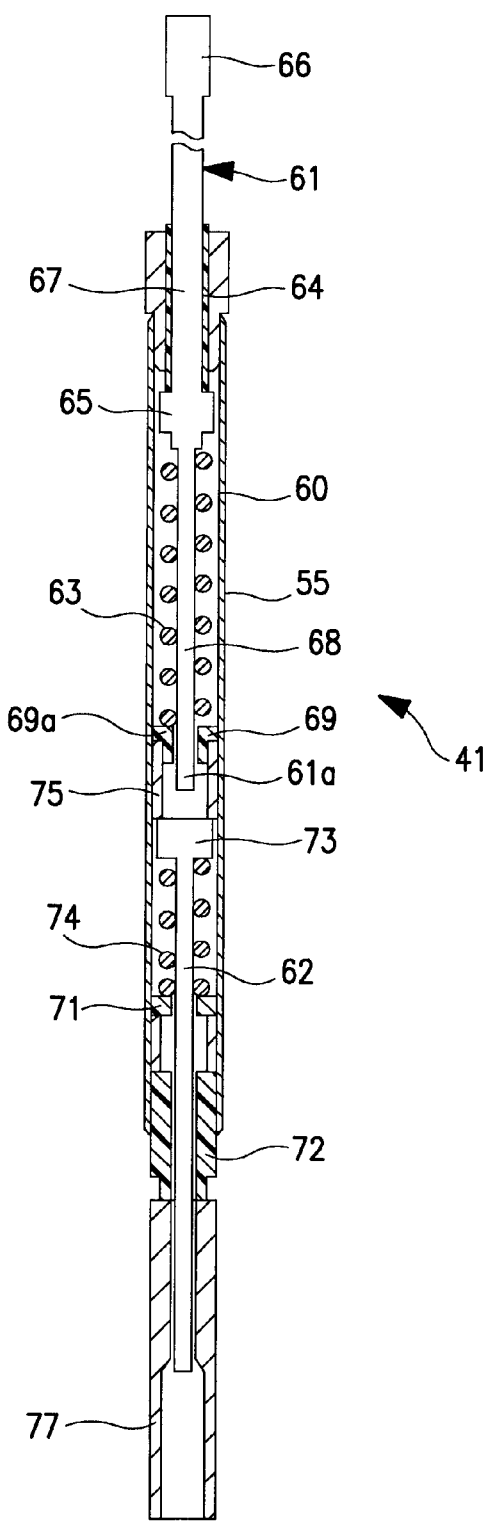
FIG. 5A is a section of a probe in the wire insertion-detecting jig used in the wire mount instructing/testing apparatus.
Figure 5B:
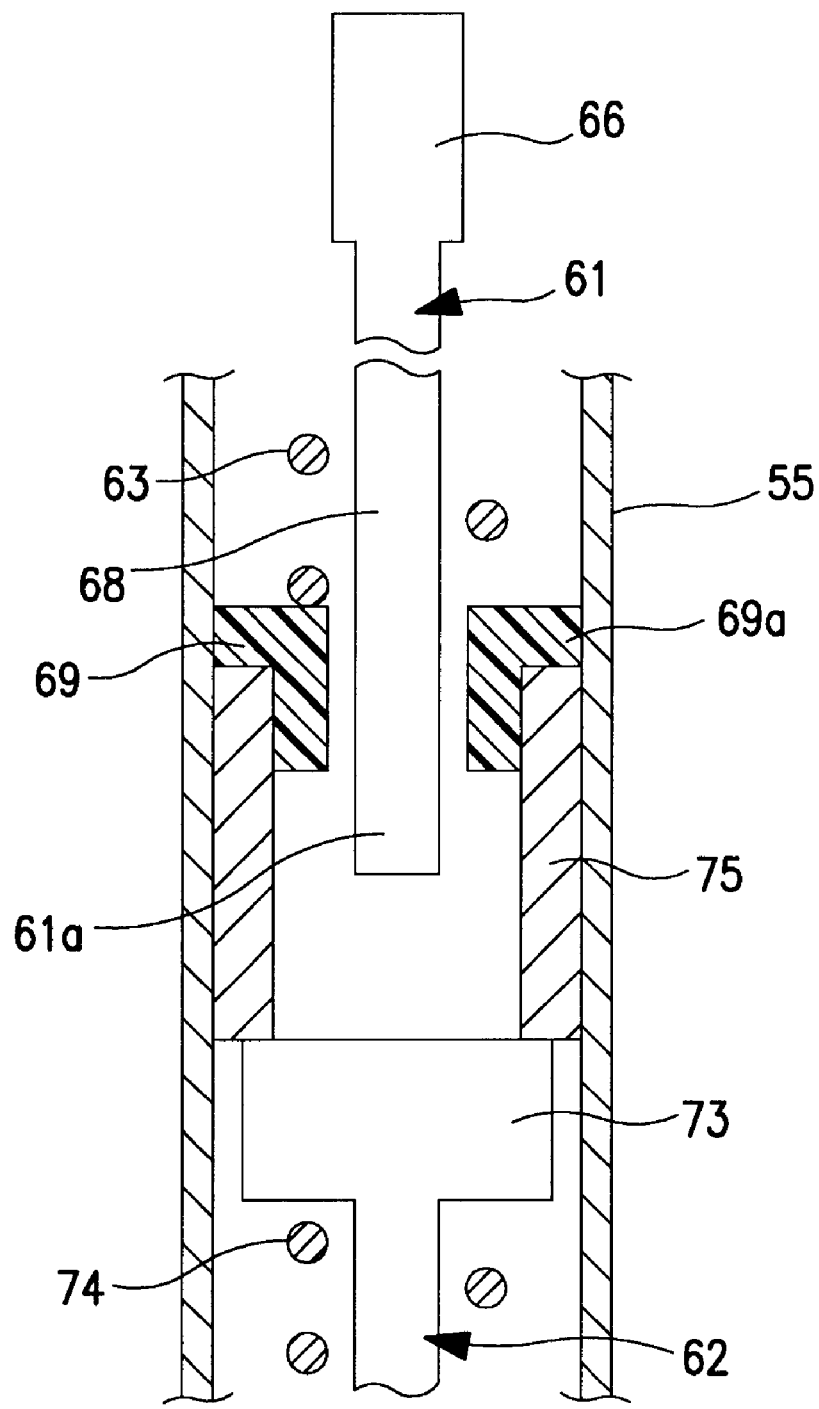
FIG. 5B is an enlarged section showing a natural state of the probe used in the wire insertion-detecting jig.
Figure 5C:
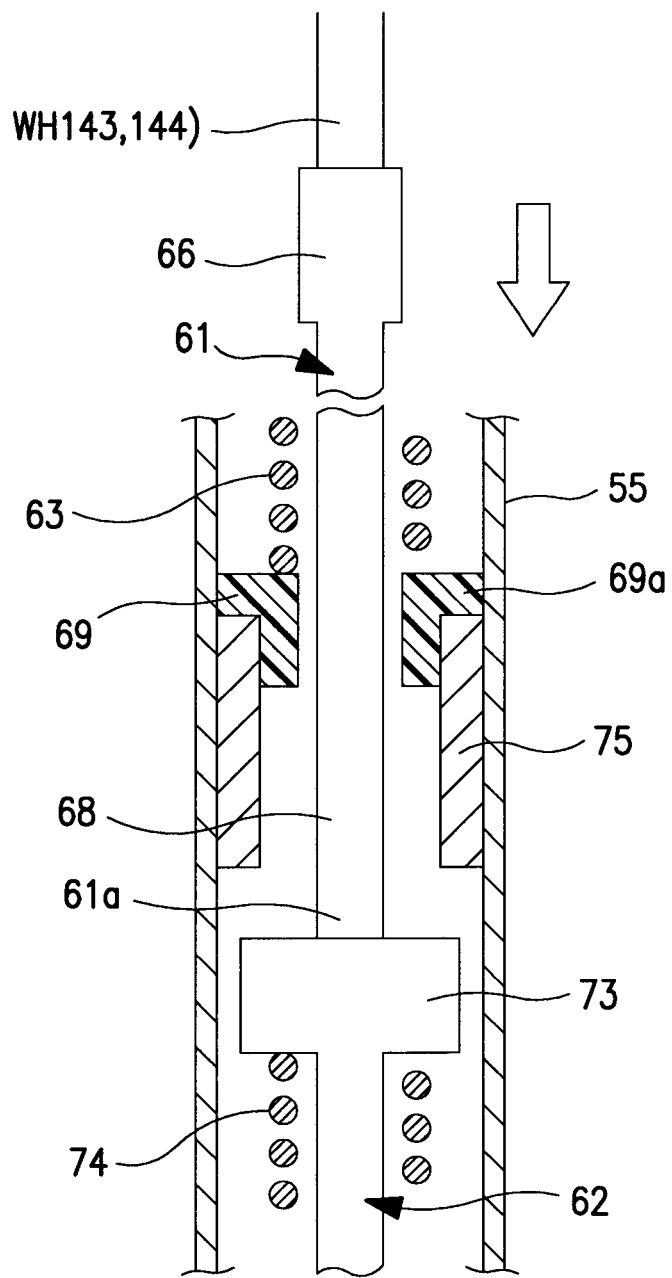
FIG. 5C is an enlarged section showing a wire-inserted state of the probe used in the wire insertion-detecting jig.

As shown in FIGS. 5A–5C, each probe 41 has a substantially bar-shaped plunger 61 loosely fitted into a top side of a through hole 60 inside the conductive barrel 55, such that the plunger 61 projects upward toward the wire that is to be inserted into the respective cavity Cab. Additionally, a substantially bar-shaped rod 62 is loosely fitted into a bottom side of the through hole 60.

The upper and lower halves of the plunger 61 define upper and lower bars 67 and 68, respectively. The upper bar 67 is loosely fitted into a tubular stopper 64 secured to the upper end of the inner surface of the through hole 60 of the barrel 55, and the lower bar 68 is loosely fitted into a substantially tubular guiding tube 69 secured to a middle portion of the inner surface of the through hole 60 of the barrel 55. The tubular stopper 68 and the guiding tube 69 both are formed from an electrically insulating material, such as resin. Accordingly, the plunger 61 is loosely movable along a longitudinal and preferably substantially vertical direction in the upper half of the through hole 60 without electrically contacting the barrel 55. A spring bearing portion 65 bulges radially outward in a middle position of the plunger 61, and a flange 69a is formed on the guiding tube 69 secured in the barrel 55. A biasing member 63, such as a coil spring, extends between the flange 69a and the spring bearing portion 65, and urges the plunger 61 upwardly. More particularly, biasing forces of the biasing member 63 hold the spring bearing portion 65 of the plunger 61 in contact with the bottom end of the electrically insulating tubular stopper 64 that is secured to the upper end of the barrel 55. Thus, the upper bar 67 of the plunger 61 projects at least partly from the upper end of the barrel 55, at least as long as the leading end head 66 at the upper end of the plunger 61 is not pushed down by the wire.

The rod 62 is loosely fitted into collars 71, 72 that are secured to a bottom part of the inner surface of the through hole 60 of the barrel 55. The collars 71, 72 both are made of an electrically insulating material, such as resin. Accordingly, the rod 62 is loosely movable along vertical direction in the lower half of the through hole 60 without electrically contacting the barrel 55. A spring bearing portion 73 bulges radially outward at the upper end of the rod 62, and is biased upward by a biasing member 74, such as a coil spring, that is supported on the upper insulating collar 71. Biasing forces of the biasing member 74 disengageably hold the spring bearing portion 73 of the rod 62 in contact with the bottom end of a conductive tubular or ring-shaped contact element or stopper 75. The contact element 75 is connected electrically with and secured to the inner surface of the barrel 55 in its natural state, as shown in FIG. 5B. Thus, the rod 62 is connected electrically with the barrel 55 via the contact element 75, as shown in FIG. 5B, as long as the spring bearing portion 73 of the rod 62 is not pushed down by a bottom end 61a of the plunger 61, as shown in FIG. 5C. A connecting tube 77 is shown in FIG. 5A for connecting the bottom end of the rod 62 to a lead wire (see 78 in FIG. 4) for external connection by soldering or the like. The connecting tube 77 is secured only to the bottom end of the insulating collar 72 that projects down from the barrel 55, and thus is held electrically disconnected from the barrel 55.

Figure 2:
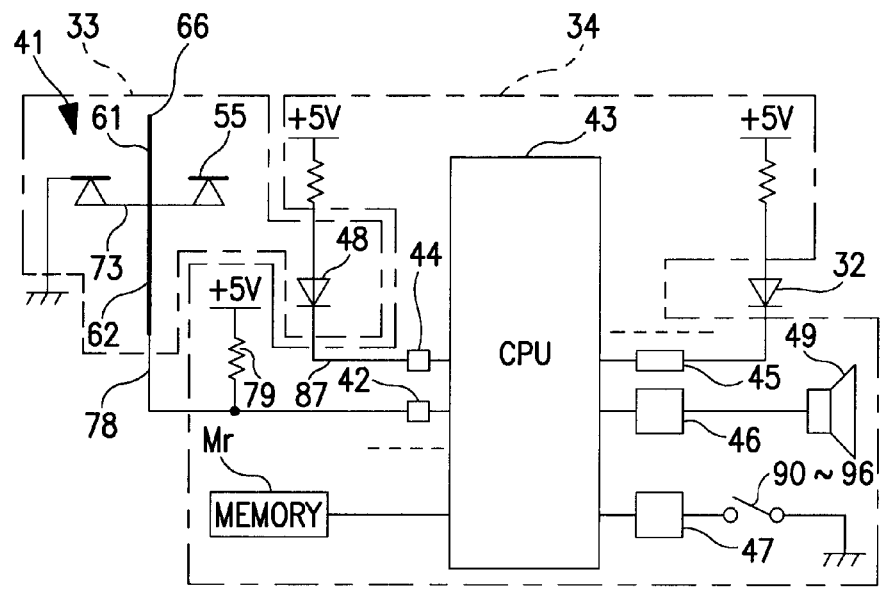
FIG. 2 is a circuit diagram schematically showing the entire wire mount instructing/testing apparatus.

The spring bearing portion 65 of the plunger 61 is biased upward by the biasing member 63, and in the natural state of the probe 41, as shown in FIG. 5B, the rod 62 is spaced below the plunger 61. This causes the spring bearing portion 73 of the rod 62 to be biased upward by the biasing member 74, and into contact with the conductive contact element 75 that will be held at a ground potential (first potential) of the barrel 55. On the other hand, an end of a wire WH inserted into the cavity Cab of the connector Cn, as shown in FIG. 5C, pushes the leading end head 66 of the plunger 61 of the probe 41 down in the opening 52a formed in the upper surface of the wire insertion-detecting jig 33. The bottom end 61a of the plunger 61 then pushes the spring bearing portion 73 of the rod 62 down. As a result, the rod 62 is disengaged from the contact element 75 and electrical connection between the rod 62 and the barrel 55 is cancelled. As shown in FIG. 2, the bottom end of the rod 62 of the probe 41 is connected to a pull-up resistor 79 via the lead wire 78 for external connection, and a point of connection with the pull-up resistor 79 is connected to the CPU 43 via the detection signal input/output circuit 42. By this construction, the probe 41 is held in its natural state and at the ground potential of the barrel 55, as long as the wire does not contact the leading end head 66 of each respective probe 41. Thus a signal inputted to the CPU 43 via the detection signal input/output circuit 42 is a LOW signal. On the other hand, the electrical connection of the probe 41 with the grounded barrel 55 is cancelled when the wire comes into contact with the leading end head 66 of the probe 41. Thus a signal inputted to the CPU 43 via the detection signal input/output circuit 42 becomes a HIGH signal.

A touch plate 81 is provided on one side surface of each wire insertion-detection jig 33, as shown in FIGS. 3 and 4, and is to be connected with the metal plating 56 and the ground lead wire 57 of the base plate 54 via a connecting piece 80. An operator can lower a voltage of the wire to the LOW ground potential or state any time by bringing an end of the wire into contact with the touch plate 81. Accordingly, the voltage level of the entire wire can be lowered from HIGH to LOW any time by bringing the second end of the wire into contact with the touch plate 81 when the first end of the wire is at the HIGH second potential or state due to its contact with the probe 41 in the wire insertion-detecting jig 33. Such an operation enables the wire arbitrarily selected by the operator to be easily recognized by the CPU 43.

If the purpose is only to detect the contact of the wire, the plunger 61 may be omitted and, instead, the rod 62 may project from the upper end of the barrel 55. The force exerted by an operator to insert the terminal differs over time and from person to person. Thus, the probe 41 is designed to switch the potential easily and securely merely by distancing the rod 62 from the contact element 75 by the contact of the plunger 61 after the plunger 61 and the rod 62 are moved away from each other in the natural state.

The guiding LEDs 48 are provided in portions of the upper surface of the wire insertion detecting jig 33 adjacent the opening 52a and at locations that correspond with the locations of the probes 41 in the accommodating portion 52. The guiding LEDs 48 are connected to the lead wire 87 and the driving circuit 44 in the control unit 34 shown in FIG. 2, and are activated and deactivated, to turn on and off or blink, in accordance with a drive control executed by the CPU 43.

A lock 84, as shown in FIGS. 3 and 4, holds the connector Cn mounted in the accommodating portion 52. The lock 84 includes an elongate base 84a with a specified elasticity. The base 84a is supported by the wire insertion-detection jig 33 for rotation about an axis of 85 in an intermediate position on the elongate base 84a. A substantially wedge-shaped claw 84b is formed at the upper end of the lock 84, and a biasing member 86, such as a coil spring, biases a bottom portion of the base 84a in the direction of arrow X1. Thus, the leading end of the claw 84b is biased to overlap part of the opening 52a, as shown in FIGS. 3 and 4. The portion of the claw 84b that overlaps the opening 52a includes a tapered upper surface 84c that slants down toward the opening 52a. The connector Cn can be pushed down against the tapered surface 84c. Forces generated by the connector Cn on the tapered upper surface 84c of the claw 84b cause the base 84a to deflect and to pivot against the forces of the biasing member 86. Thus the claw 84b will move away from the opening 52a sufficiently for the connector Cn to enter the accommodation portion 52. The connector Cn eventually will move below the leading end of the claw 84b. At this point, the elastic restoring force of the base portion 84a and the forces of the biasing member 86 will move the leading end of the claw 84b back to its initial position where the claw 84b partly overlaps the opening 52a and partly overlies the connector Cn. Thus, the claw 84b prevents the connector Cn from coming up out of the opening 52a.

Next, the control unit 34 is described.

Information on the mount positions of the opposite ends of the wires in the connectors (i.e. the aforementioned correspondence between the wires and the probes 41) for the respective product numbers of various subassemblies is stored in a nonvolatile memory Mr of the control unit 34, as shown in FIG. 2. The memory may, for example, be a ROM, EPROM, EEPROM, CD-ROM, a storage disc, or the like. As a result, the wire end mounting processes and an electrical connection testing process can be performed efficiently in accordance with information registered in the control unit 34.

A coupling piece 34a is fixed to the bottom end of the front surface of the control unit 34, as shown in FIG. 1, and is cantilevered fixedly at the upper end of the fixed plate 35b to which the wire insertion detecting jigs 33 are mounted. The bottom end of the rear surface of the control unit 34 is placed on the upper ends of the supplying channels 31a of the wire-supplying unit 31.

Figure 6:
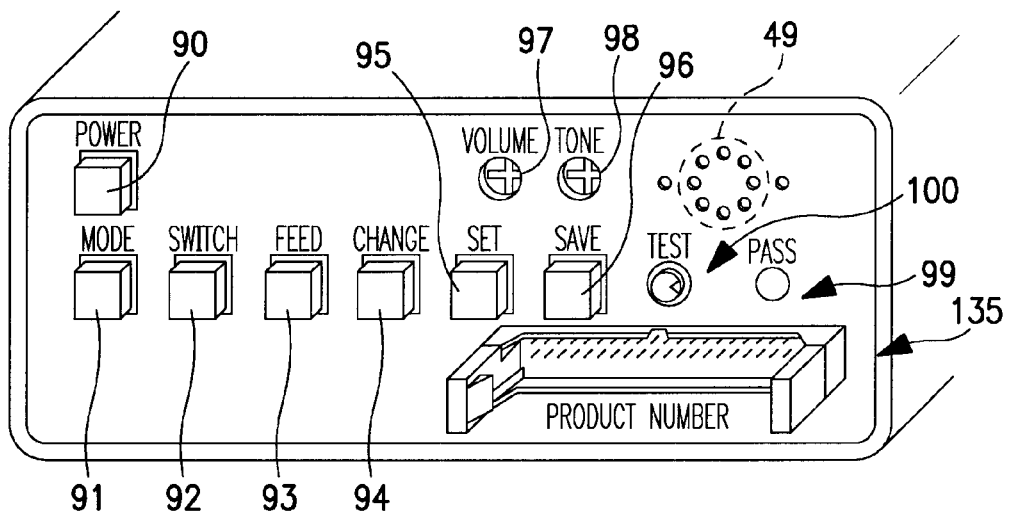
FIG. 6 is a perspective view showing a front surface of a control unit used in the wire mount instructing/testing apparatus.

An operation panel is provided on the front surface of the control unit 34 and preferably is used for the operation of the entire wire mount instructing/testing apparatus. As shown in FIG. 6, the operation panel includes: various operation switches 90 to 96, the buzzer 49, a volume adjusting screw or knob 97 for adjusting a buzzing volume of the buzzer 49, a tone adjusting screw 98 for adjusting a buzzing frequency (tone) of the buzzer 49, a success indicator or display or lamp (success LED) 99 which is turned on when the subassembly passes a test on the wire mount, a pedal connecting terminal 100 for connecting a specified pedal switch (not shown), and a connection port 135 for connecting the product number switching board 36 to be described later.

The operation switch 90 is a main power switch, and the operation switch 91 is a mode switch. The mode switch 91 enables switching between a data registration mode, in which data are registered for each of the product numbers of the subassemblies, and an operation mode, in which the wires are guided to and mounted into the connectors, and in which the mounted states of the wires are tested. The operation switch 93 is a feed switch for successively designating the plurality of supplying channels 31a and the instructing LEDs (see FIG. 1) of the wire-supplying unit 31.

The feed switch 93 also designates the wire mount positions (positions of the probes 41 in FIG. 4) in the wire insertion detecting jigs 33, the guiding LEDs 48, etc. to specify them when the product number is registered. The operation switch 92 is a changeover switch for switching an object of the feed switch 93 to be successively changed to the wire supplying unit 31 (instructing LEDs 32 (FIG. 1), etc.), the wire insertion detecting jigs 33 (guiding LEDs 48) and the like when the product number is registered. The operation switch 94 is a change switch for erasing the product number registered in correspondence with the supplying channels 31a of the wire supplying unit 31 or replacing an operation sequence and the correspondence with the supplying channels 31a to change them. The operation switch 95 is a set switch as a confirmation button for the contents set by the change switch 94 and other switches. The operation switch 96 is a save switch for saving the contents confirmed by the set switch 95 in the nonvolatile memory Mr shown in FIG. 2, such as an EEPROM or flash memory.

The pedal switch connected with the pedal connecting terminal 100 switches the operation mode of the instructing/testing apparatus between a manual testing mode and an automatic testing mode. An operator can forcibly start manual testing (manual mode) or switch to automatic operations (automatic testing mode) such as an <A-end mounting process>, a <B-end mounting process> and an <electrical connection testing process> any time by pushing the pedal switch, in any case, including a case where the actual operation is being performed. For example, if there is a break during the operation, an operator may have forgotten in which step he interrupted the operation when he tries to resume the operation after the break. In such a case, the testing is started by pushing the pedal switch to judge the progress of the operation based on, e.g. the blinking state of the instructing LED 32.

Figure 7:
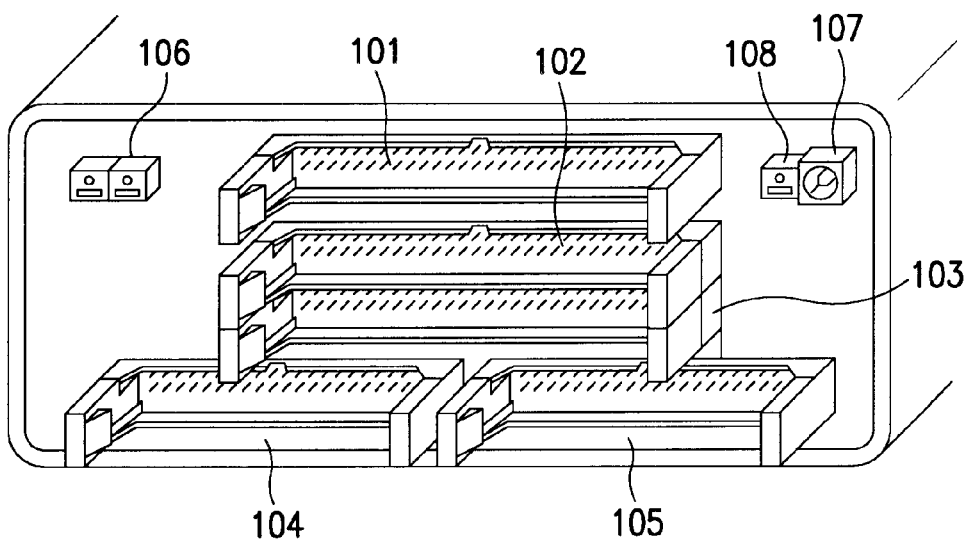
FIG. 7 is a perspective view showing a rear surface of the control unit used in the wire mount instructing/testing apparatus.

The rear surface of the control unit 34 is shown in FIG. 7, and includes a connecting terminal group for connecting external equipment with the respective parts of the wire mount instructing/testing apparatus. Specifically, the connecting terminal group includes a guiding LED power supply port 101 for supplying a power supply of, e.g., 5 volts to anodes of the respective guiding LEDs 48 of the wire insertion detecting jigs 33, a guiding LED driving port 102 for turning the guiding LEDs 48 on and off at their cathode sides, a probe interface port 103 connected with the rods 62 of the probes 41 of the wire insertion detecting jigs 33, an instructing LED power supply port 104 and an instructing LED driving port 105 connected with the instructing LEDs 32 of the wire supplying unit 31. The ports 101, 102 and 103 contain, for example, 60 pins, whereas the ports 104 and 105 contain, for example, 40 pins. Two success output terminals 106 send output signals to an external device such as stamper (not shown) for marking "Success Stamp" or the like when the subassembly passes the test. A power terminal 107 can be connected e.g. with an AC adapter for connection with a commercial power supply, and a grounding terminal 108 can be connected to ground the metal plating 56 of the base plate 54 and the touch plate 81 via the ground lead wire 57.

Figure 8:
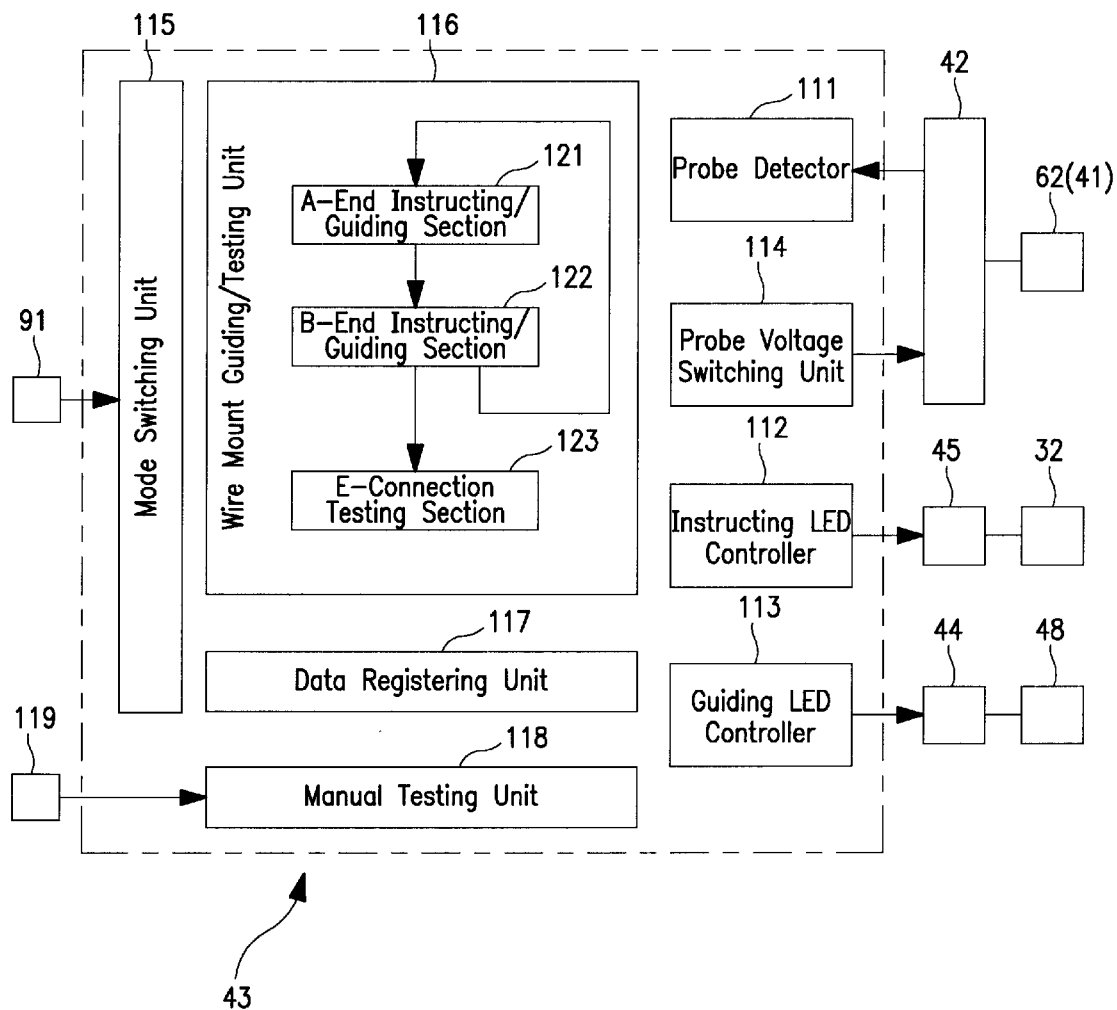
FIG. 8 is a block diagram showing functions of a CPU in the control unit used in the wire mount instructing/testing apparatus.

FIG. 8 is a function block diagram showing the functional construction of the CPU 43 in the control unit 34. The CPU 43 operates in accordance with a specified software program stored in the memory Mr (see FIG. 2), and is provided with a probe detector 111, an instructing LED controller 112, a guiding LED controller 113, a probe voltage switching unit 114, a mode switching unit 115, a wire mount guiding/testing unit 116, a data registering unit 117, and a manual testing unit 119 as shown in FIG. 8. The probe detector 111 detects the voltage level (HIGH or LOW) of the rod 62 of each probe 41 in accordance with a signal inputted from the detection signal input/output circuit 42. The instructing LED controller 112 controllably turns the instructing LEDs 32 on and off using the driving circuit 45. The guiding LED controller 113 controllably turns the guiding LEDs 48 on and off using the driving circuit 44. The probe voltage-switching unit 114 switches the voltage level (HIGH or LOW) of the rod 62 of each probe 41 by sending a signal to the detection signal input/output circuit 42. The wire mount guiding/testing unit 116 instructs and guides the mounting of the A-ends and B-ends of a wire for a subassembly of the product number designated by the operator, and tests electrical connections after the subassembly is completed. The mode switching unit 115 switches the mode between the data registration mode and the operation mode based on the state of the mode switch 91. The wire mount guiding/testing unit 116 instructs and guides the respective ends (terminals) of the wires to the mount positions by repeating the A-end mounting process and the B-end mounting process described later for the subassembly of the product number specified by the operator, and finally performs the electrical connection testing process described later. The data registering unit 117 performs a data registering process described later when the mode is switched to the data registration mode by the mode switch 115. The manual testing unit 118 performs a manual testing process described later when the pedal switch 119 connected with the pedal connecting terminal 100 shown in FIG. 6 is pushed.

The units 116, 117 and 118 display their respective functions while causing the probe detector 111 to detect the voltage level of each probe 41 and the LED controllers 112 and 113 to execute controls to turn on and off and blink the respective LEDs 32, 48. The wire mount guiding/testing unit 116 includes an A-end instructing/guiding section 121 for performing the A-end mounting process, an B-end instructing/guiding section 122 for performing the B-end mounting process, and an electrical connection testing section 123 for performing the electrical connection testing process. The operations in the A-end and B-end instructing/guiding sections 121, 122 are repeated until all necessary wires are connected with the respective connectors of a subassembly of one product number, and the electrical connection testing section 123 tests the completed subassembly as a final confirmation upon completion of the operations in the sections 121, 122. More particularly, the unit 116 includes an A-end instructing/guiding section 121 for instructing and guiding the mounting of the A-ends, an B-end instructing/guiding section 122 for instructing and guiding the mounting of the B-ends, and an electrical connection testing section 123 for testing the electrical connections after the subassembly is completed. The operations in the A-end and B-end instructing/guiding sections 121, 122 are repeated for each wire or the operations in the B-end instructing/guiding section 122 are performed for a plurality of wires after the operations in the A-end instructing/guiding sections 121 are performed for them. These operations are completed until all necessary wires are connected with the respective connectors of the subassembly of one product number. The electrical connection testing section 123 then tests the completed subassembly as a final confirmation upon completion of the operations in the sections 121, 122.

The respective functional elements 111 to 123 in the CPU preferably all are defined as subprograms or subroutines of the software program or parts of a specified program. Here, no description is given on the details of the individual operational functions since they are described later in the descriptions of the A-end mounting process, B-end mounting process, electrical connection testing process and data registering process.

The volume and tone adjusting screws 97, 98 on the front surface of the control unit 34 are adapted to change the buzzing volume and the buzzing frequency (tone) of the buzzer 49 by being rotated or manipulated. If several wire mount instructing/testing apparatuses are installed close to each other, the buzzing sounds of the respective apparatuses can be made distinguishable using these screws 97, 98 to prevent confusion.

Figure 9:
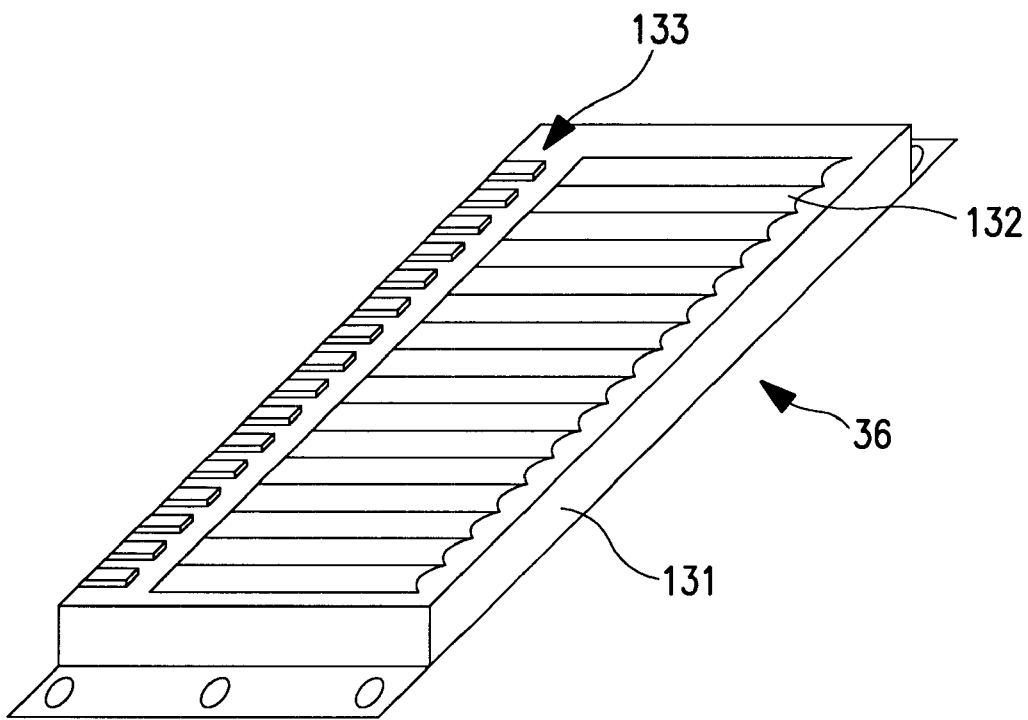
FIG. 9 is a perspective view of a product number switching board used in the wire mount instructing/testing apparatus.
Figure 10:
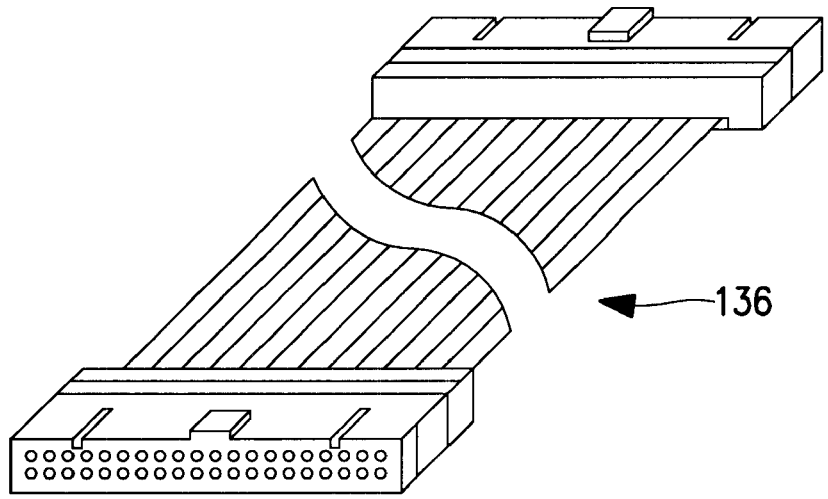
FIG. 10 is a perspective view of a flat cable for connecting the product number switching board and the control unit.

The product number switching board 36 can be used to set any of a plurality (e. g. 16) of types of products. Specifically, as shown in FIG. 9, paper tickets that bear product numbers can be inserted into holders 132 on the upper surface of a board main body 131 to construct a product number list. An operator can select a desired product number by pushing one of the product number switches 133 e.g. in the form of push-buttons arranged at the left side of holders 132 while looking at the product numbers written on the number tickets in the holder 132. Here, the product number switches 133 are made e.g. of a transparent resin of red, yellow or other color, and light emitters (not shown) such as LEDs are provided at the rear sides of the switches 133. When the product number switch 133 is pushed, the light emitter on its rear side immediately emits a light to illuminate the product number switch 133, displaying the product number designated by the operator by illumination. The switching board 36 is connected to the connection port 135 (see FIG. 6) provided on the front surface of the control unit 34 via a flat cable 136 shown in FIG. 10.

Figure 11:
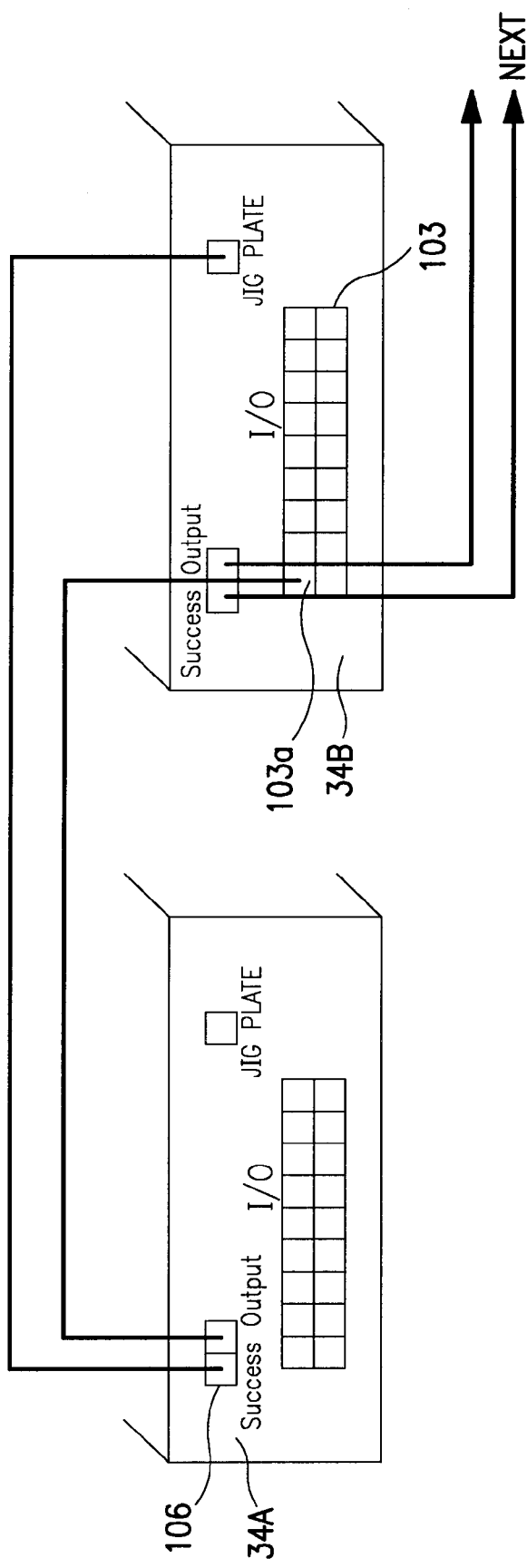
FIG. 11 is a diagram showing the rear surfaces of the control units when a plurality of wire mount instructing/testing apparatuses is used in combination.

It is possible that the number of wires to be assembled will exceed the capacity of a single wire mount instructing/testing apparatus. In this case, a plurality of wire mount instructing/testing apparatuses are connected in series and/or in parallel, and are used in combination to significantly increase the numbers of connectors and wires to be handled. Specifically, the control unit 34 can output a success signal representing successes in all tests on the wire mount conducted by the control unit 34 from the success output terminals 106 on the rear surface of the control unit 34, as shown in FIG. 11. One of the two success output terminals 106 of a control unit 34A of one wire mount instructing/testing apparatus may be connected with one connection pin 103a of the probe interface port 103 of the other apparatus 34B, whereas the other of the two success output terminal 106 may be connected with the grounding terminal 108 of the other apparatus. In such a case, the final apparatus outputs a success signal by taking a logic multiplication of the successes in all tests in the first apparatus and the successes in all tests in the second apparatus. In this way, a success signal representing successes in all tests in a plurality of wire mount instructing/testing apparatuses can be outputted at once. If, for example, the probe interface port 103 contains 60 connection pins, one of the 60 connection pins of the probe interface port 103 of the second or succeeding wire mount instructing/testing apparatus is used for the apparatus-to-apparatus connection, but the remaining 59 pins can be used for the tests.

A notice board 139 is shown in FIG. 1 for receiving with pins, magnets or clips to secure memos that have an operation schedule or the like.

The wire mount instructing/testing apparatus uses the wire insertion-detection jigs 33 to control the mounting of the respective wires into a plurality of connectors at once and to simultaneously test the mounted states of the wires. The instructing LEDs 32 successively instruct the operator which wires to be taken out, and the guiding LEDs 48 inform the operator of the positions in the connector into which the respective terminals of the wires should be inserted. Accordingly, a defect caused by an improper arrangement can be prevented, and whether the wire was properly inserted can be tested based on an electrical connection. Thus, quality assurance in the manufacturing process can be achieved without increasing the number of operation steps, as explained further below.

Figure 12:
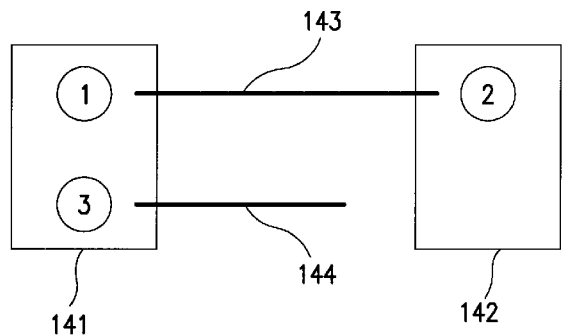
FIG. 12 is a diagram showing a model harness used for the embodiment of the invention.

An overall flow of operations is briefly described before describing the operations in detail. For an easier understanding, a subassembly of a wiring harness as shown in FIG. 12 is used as an example. In this subassembly, one cavity ① of a connector 141 at an A-end and one cavity ② of a connector 142 at a B-end are connected by one wire 143. Another wire 144 is connected with another cavity ③ of the connector 141, but not with the connector 142.

Figure 13:
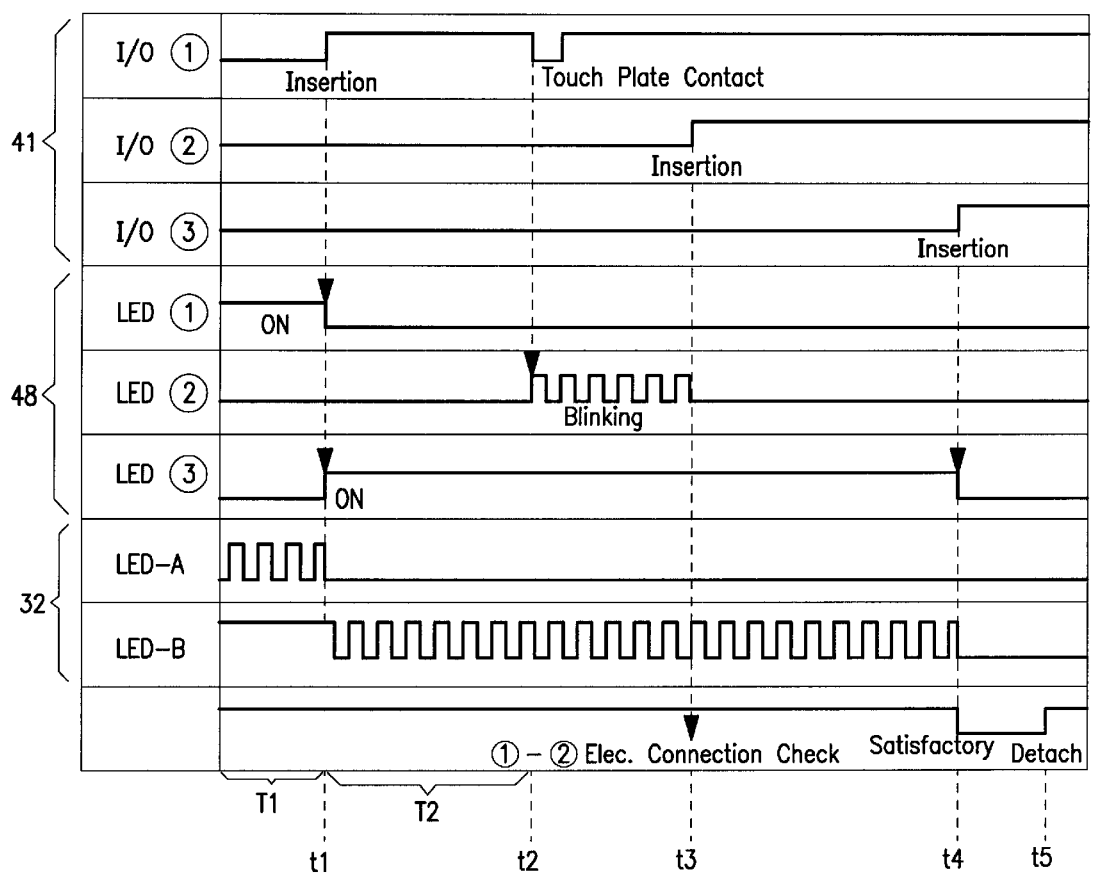
FIG. 13 is a timing chart showing an operation of the wire mount instructing/testing apparatus.

An operation procedure for this example is shown in the timing chart of FIG. 13. Specifically, the operation is started with none of the probes 41 contacted by the wire. Hence, during the time T1, the instructing LED 32 (LED-A in FIG. 13) of the supplying channel 31*a* is blinked to identify the wires that are to be taken out first to form this subassembly, and all other instructing LEDs 32 (LED-B in FIG. 13) corresponding to the wires used for this subassembly are turned on. Simultaneously, the guiding LED 48 (LED ①) that corresponds to the cavity ① of the A-end side wire insertion-detecting jig 33 in which the A-end side connector 141 is mounted is turned on. Since no wire is in contact with any of the probes 41 at this stage, all the probes 41 (I/O① to I/O③ in FIG. 13) are held at LOW (first potential) by being grounded by the barrels 55.

An operator mounts the A-end of the wire 143 of FIG. 12 into the cavity ① of the connector 141 in accordance with the turned-on guiding LED 48 (LED① in FIG. 13). Then, the voltage level of the probe 41 pressed by the A-end of the wire 143, i.e. the I/O① in FIG. 13, rises to HIGH (second potential) and, accordingly, the guiding LED 48 (LED① in FIG. 13) that had been on is turned off. Almost simultaneously, the guiding LED 48 (LED③ in FIG. 13) corresponding to the cavity ③ (see FIG. 12) of the connector 141 in the A-end side wire insertion detecting jig 33 into which a wire should be inserted next is turned on. Further, the blinking instructing LED 32 (LED-A in FIG. 13) is turned off, and the instructing LED 32 (LED-B in FIG. 13) of the supplying channel 31*a* accommodating the wire to be taken out next is blinked.

At this stage, the operator may mount the A-end of the wire 144 into the cavity ③ of FIG. 12 in accordance with the illuminated instructing LED 32. However, it frequently is more convenient to first complete the wire 143 already being handled. In such a case, the operator brings the B-end of the wire 143 into contact with the touch plate 81 at t2 after the lapse of a period T2. Since the touch plate 81 is grounded, the voltage level of the wire falls to LOW at t2, which is sent to the I/O① in FIG. 13 of the probe 41 pressed by the A-end of the wire 143 to change the state thereof to LOW. The CPU 43 of the control unit 34 detects such a change and causes a blinking of the guiding LED 48 (LED②) in FIG. 13) that corresponds to the cavity ② of the connector 142 in the B-end side wire insertion-detecting jig 33 for the B-end of the wire 143. The operator inserts the B-end of the wire 143 into the cavity ② (see FIG. 12) of the connector 142 in the B-end side wire insertion-detecting jig 33, for example, at t3 upon looking at the blinking guiding LED 48 (LED② in FIG. 13). The probe 41 in the cavity ② is pressed to raise the voltage level of the I/O② in FIG. 13 to HIGH and, accordingly, the guiding LED 48 (LED② in FIG. 13) that had been on is turned off.

After t3, the LED③ in FIG. 13 is held on, and the LED-B blinks. The operator takes the next wire 144 from the supplying channel 31*a* corresponding to the blinking instructing LED 32 (LED-B in FIG. 13), and inserts the A-end of the wire 144 into the cavity ③ of FIG. 13, for example, at t4. At this time, similar to the above, the voltage level of I/O③ of FIG. 13 rises to HIGH and, accordingly, the guiding LED 48 (LED③ in FIG. 13) that had been on is turned off and the blinking instructing LED 32 (LED-B in FIG. 13) is turned off. In this case, the operator is notified of a success due to a determination of a successful achievement of the state shown in FIG. 12. Thereafter, the completed subassembly comprised of the wires 143, 144 and the connectors 141, 142 is taken out from the respective wire insertion detecting jigs 33 at t5.

The data registering process described later is carried out using a specified harness model that has substantially the same connection construction as the one shown in FIG. 12. Thus, data on the instructions and guides for the insertions to form the subassembly are stored in the memory Mr by extraction teaching or teach-in of a reference sample. Extraction teaching advantageously shortens the time required for the data registration. A teach-in procedure may include the following steps: inserting a model connector or harness into the corresponding jigs and detecting the circuit formed by such model connectors or harness e.g. by applying a current or voltage or signal to the probes 41; then, after the model has been withdrawn, activating the instructing indicators 32 to identify the wire to be taken from a supplying channel 31*a*. Then the operator chooses the insertion hole Cab of the connector Cn to teach where the respective wire end should be inserted. Once the wire is inserted (detected e.g. by the change in voltage of a probe 41 of the connector Cn) the system or control 34 knows where the other end of the wire ("B-end") should be inserted, as this is already known from the model connectors or harness. Accordingly, there is no need to teach in the insertion position of the B-end of the wire.

The above operations are described in detail, centered on exemplary operations of assembling a subassembly, by performing similar operations for the succeeding wires after the A-end and B-end of one wire are connected with the connector.

The use of the wire mount instructing/testing apparatus is described in greater detail below. For this operation, various pieces of information including a relationship in connection between the respective wires 143, 144 and the connectors 141, 142 and information on the supplying channels 31*a* that accommodate the respective wires 143, 144 are registered beforehand in the memory Mr of the control unit 34 of the wire mount instructing/testing apparatus using a model harness that has substantially the same construction as the subassembly shown in FIG. 12.

FIG. 13 is a timing chart showing the operation of the wire mount instructing/testing apparatus. The apparatus is started with none of the probes 41 contacted by the wire. The A-end of the wire 143 of the subassembly shown in FIG. 12 then is inserted into the cavity ① of the A-end side connector 141.

At this stage, the CPU 43 sends a signal to the driving circuit 44 to blink the instructing LED 32 (LED-A in FIG.

13) that corresponds to the supplying channel 31a with the wire of the subassembly that is to be taken out first and to turn on all of the other instructing LED(s) 32 (LED-B in FIG. 13) that are to be used for the subassembly during a time T1 in FIG. 13. Simultaneously, the guiding LED 48 (LED①in FIG. 13) that correspond to the cavity ① of the A-end side wire insertion-detecting jig 33 in which the A-end side connector 141 is mounted is turned on.

The wires do not contact the probes 41 in the wire insertion detecting jigs 33 at this stage. Hence, the spring bearing portions 65 of the plungers 61 of the probes 41 are biased upward by the biasing members 63 and into the natural state shown in FIG. 5A. Accordingly, the bottom ends of the plungers 61 are spaced above the spring bearing portions 73 of the rods 62 below the plungers 61, as shown in FIG. 5B. Thus, the rods 62 also are held in their natural state, and the spring bearing portions 73 of the rods 62 are biased upward by the biasing members 74 to bring the rods 62 (I/O① to I/O③ in FIG. 13) of all the probes 41 into contact with the conductive contact elements 75, thereby holding the rods 62 at the same ground potential (first potential: LOW) as the barrels 55.

The operator at time t1 inserts the A-end of one wire 143 in FIG. 12 into the cavity ① of the connector 141 that has the illuminated guiding LED 48 (LED① in FIG. 13). Then, the A-end of the wire 143 contacts the leading end head 66 of the probe 41, as indicated by WH in FIG. 5C, thereby pushing the probe 41 down. At this time, the plunger 61 is moved down against the biasing force of the biasing member 63 in the barrel 55, and the bottom end 61a of the plunger 61 contacts the spring bearing portion 73 of the rod 62 to push the rod 62 down as shown in FIG. 5C. The rod 62 is moved down against the biasing force of the biasing member 74 in the barrel 55. As a result, the rod 62 and the contact element 75 are distanced from each other to cancel an electrical connection between the rod 62 and the barrel 55. The bottom end of the rod 62 of the probe 41 is connected to the power supply of, e.g. 5 volts, via the lead wire 78 and the pull-up resistor 79 as shown in FIG. 2. Therefore, the rod 62 is disconnected electrically from the barrel 55 and held at ground potential, to change the voltage level of the rod 62 from LOW to HIGH. Such a voltage change is sent to the CPU 43 via the detection signal input/output circuit 42, and the CPU 43 determines that the A-end of the wire has been inserted into the cavity Cab of the connector Cn corresponding to the position of the probe 41 whose voltage level had risen to HIGH (second potential).

Upon such a detection, the CPU 43 sends a signal to the driving circuit 45 and turns off the guiding LED 48 (LED① in FIG. 13) that had been on and turns on the guiding LED 48 (LED② in FIG. 13) that corresponds to the cavity ③ (see FIG. 12) of the connector in the A-end side wire insertion detecting jig 33 into which a wire end is inserted next. Further, the CPU 43 sends a signal to the driving circuit 44 to turn off the blinking instructing LED 32 (LED-A in FIG. 13) and to blink the instructing LED 32 (LED-B in FIG. 13) of the supplying channel 31a that accommodates the wire to be taken out next.

At this stage, the operator may insert the A-end of the other wire 144 into the cavity ③ in FIG. 12 when the guiding LED 48 that corresponds to the cavity ③ (see FIG. 12) is turned on. However, it is frequently more convenient to complete the first wire 143 that has been handled. In such a case, the operator will want to insert the B-end of the first wire 143 into the cavity ② before inserting the wire end into the cavity ③ in FIG. 12. The operator notifies his intention to insert the B-end to the wire mount instructing/testing apparatus by contacting the touch plate 81 with the B-end of the wire 143 at time t2, which is reached after a lapse of time T2 following the time t1.

The touch plate 81 is grounded. Consequently, the voltage level of the wire 143 falls to LOW at t2. At this time, the bottom end 61a of the plunger 61 contacts the spring bearing portion 73 of the rod 62, as shown in FIG. 5C. The plunger 61 then pushes down on the rod 62 of the probe 41 in the cavity ① of the connector 141 disposed in the A-end side wire insertion-detecting jig 33. Accordingly, the rod 62 and the contact element 75 separate and cancel an electrical connection between the rod 62 and the barrel 55. However, since the voltage level of the wire 143 falls to LOW at t2, the voltage levels of the plunger 61 and the rod 62 also fall to LOW. In other words, the state LOW of the I/O① of the probe 41 in the A-end side wire insertion-detecting jig 33 at t2 is sent to the CPU 43 of the control unit 34, and the CPU 43 starts guiding the B-end.

At this stage, the CPU 43 signals the driving circuit 44 to blink the guiding LED 48 (LED② in FIG. 13) that corresponds to the cavity ② (see FIG. 12) of the connector 142 in the B-end side wire insertion detecting jig 33 into which the B-end of the wire 143 is to be inserted. The operator observes the blinking guiding LED 48 (LED② in FIG. 13), and, at time t3, the operator inserts the B-end of the wire 143 into the cavity ② (see FIG. 12) of the connector 142 in the B-end side wire insertion-detecting jig 33, for example. The probe 41 in the cavity ② is pushed down to raise the voltage level of the I/O② in FIG. 13 to HIGH. In response thereto, the CPU sends a signal to the driving circuit 44 to turn off the blinking guiding LED 48 (LED② in FIG. 13).

During this time, the LED③ (guiding LED 48) remains on and the LED-B (instructing LED 32) continues blinking, as shown in FIG. 13. The operator observes these states and inserts the A-end of the other wire 143 at time t4. Specifically, the operator takes the next wire 144 from the supplying channel 31a that corresponds to the blinking instructing LED 32 (LED-B in FIG. 13), and, at time t4, the operator inserts the A-end of the wire 144 into the cavity ③ in FIG. 10 while looking at the turned-on LED ③ (guiding LED 48). At this time, the A-end of the wire WH, 144 contacts and pushes down the leading end head 66 of the probe 41. The plunger 61 then is moved down against the biasing force of the biasing member 63 in the barrel 55, as shown in FIG. 5C, and the bottom end 61a of the plunger 61 contacts and pushes down the spring bearing portion 73 of the rod 62. The rod 62 is moved downward against the biasing force of the biasing member 74 in the barrel 55. As a result, the rod 62 becomes spaced from the contact element 75 and cancels an electrical connection between the rod 62 and the barrel 55. As shown in FIG. 2, the bottom end of the rod 62 of this probe 41 is connected with the power supply of, e.g. 5 volts via the lead wire 78 for external connection and the pull-up resistor 79. Accordingly, the voltage level of the rod 62 that is disconnected electrically from the barrel 55 held at ground potential is switched from LOW to HIGH as shown in I/O③ of FIG. 13. In response thereto, the CPU 43 signals the driving circuit 45 to turn off the guiding LED 48 (LED③ in FIG. 13) that have been on and the blinking instructing LED 32 (LED-B in FIG. 13). Finally, a determination of whether the A-ends and B-ends of the wires 143, 144 are properly electrically connected is tested based on information stored beforehand in the memory Mr. In the case of passing the test, a success is notified to the operator by means of the specified buzzer 49 or a specified success lamp (not shown) or the like. Thereafter, a completed subassembly (see FIG. 12) comprised of the wires 143, 144 and the connectors 141, 142 is taken out of the respective wire insertion detecting jigs 33.

Although the A-end and B-end of the second wire 144 are mounted after those of the first wire 143 are mounted in this example, the B-ends of the wires 143, 144 may be mounted after the A-ends thereof are mounted.

The barrels 55 at the outer peripheries of all the probes 41 in the wire insertion-detecting jig are adhered to the metal plating 56 on a plurality of through holes of the base plate 54 and are commonly grounded by the one ground lead wire 57. In other words, the probes 41 can be grounded using the single ground lead wire 57 even if there are many probes 41 provided in correspondence with the cavities of the connector. Accordingly, a large space is not required for the wiring for connection, and the wiring layout can be simplified, with the result that a wire insertion detecting jig having an excellent wiring efficiency for the connection between the wire insertion detecting jig 33 and the control unit 34 can be provided.

The metal plating 56 extends from the through holes 53 to the entire upper and lower surfaces of the base plate 54 in the foregoing embodiment. However, the metal plating 56 may be formed on only one of the upper and lower surfaces or only on sufficient portions of the either surface of the base plate 54 to achieve a common connection among all of the through holes 53.

The mode switch 91 shown in FIG. 6 is grounded to the front surface of the control unit 34, and initially is set to the operation mode.

The connectors Cn that are to be assembled then are mounted respectively in the openings 52 of the respective wire insertion detecting jigs 33 prepared for the A-ends and for the B-ends. As shown in FIG. 4, each connector Cn is pushed down from above sufficiently to contact the tapered surface 84c of the lock 84 at the opening 52a of the wire insertion-detecting jig 33. Forces of the connector Cn on the tapered surface 84c cause the base 84a of the lock 84 to bend and/or pivot so that the claw 84b of the lock 84 moves sideways away from the opening 52a. These forces also compress the biasing member 86. As a result, the connector Cn can be inserted into the opening 52a. Sufficient insertion causes the upper end of the connector Cn to slip under the leading end of the claw 84b of the lock 84. The elastic restoring force of the base 84a and/or the biasing force of the biasing member 86 then return the lock 84 to its initial position. Thus the leading end of the claw 84b partially overlaps the upper surface of the connector Cn in the opening 52a and prevents the connector Cn from coming up out of the opening 52a.

Figure 14:
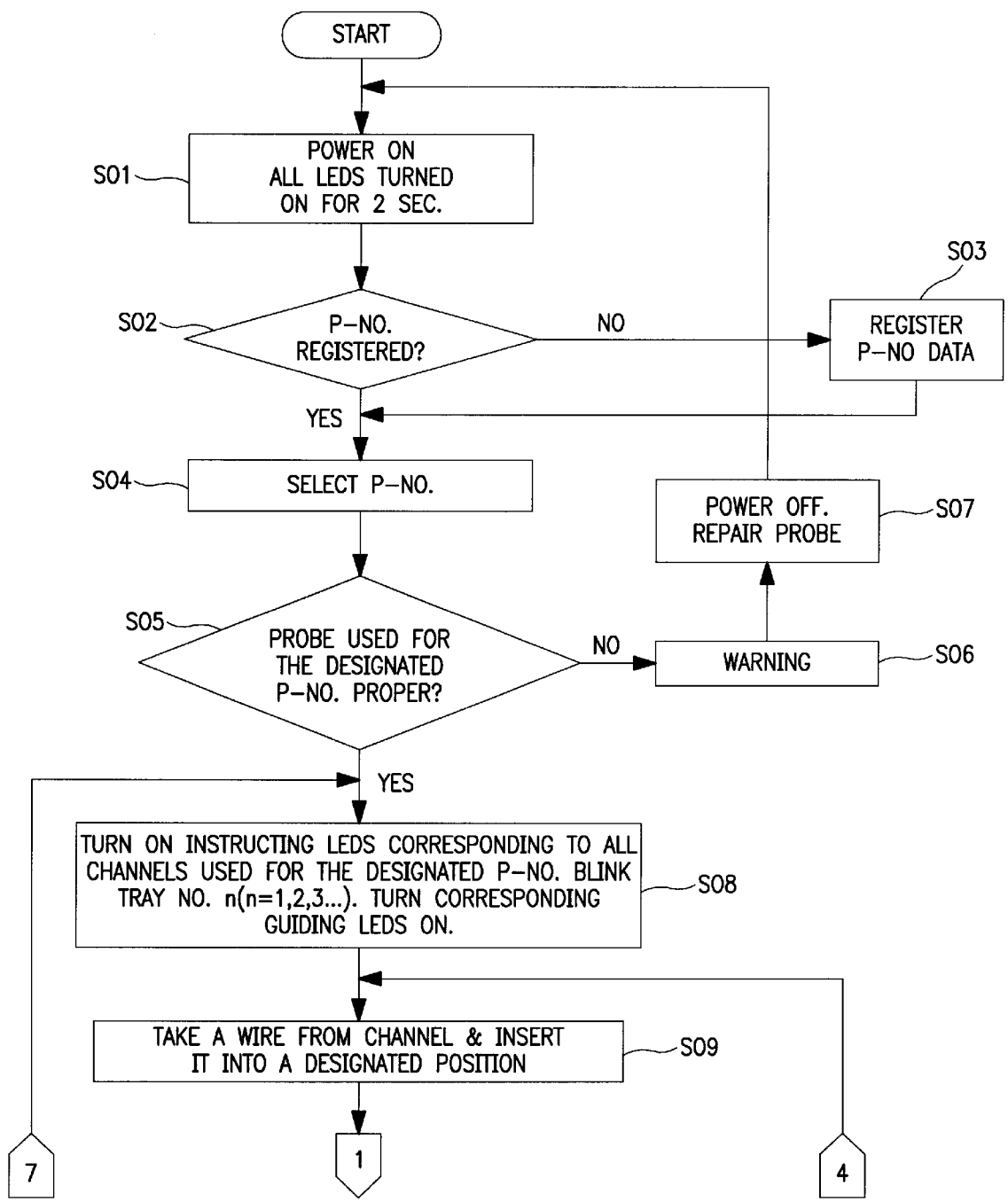
FIGS. 14 to 17 show a flow chart showing an operation procedure of wire mount instructing/testing apparatus.

Next, the main power switch 90 on the front surface of the control unit 34 shown in FIG. 6 is pushed to turn on a main power supply (Step S01 of a flow chart of FIG. 14). At this stage, control signals are sent to the driving circuits 44, 45 in FIG. 2 from the CPU 43 in the control unit 34 to turn on for about 2 seconds all the instructing LEDs 32 that correspond to the respective supplying channels 31a of the wire supplying unit 31 and all the guiding LEDs 48 of all the wire insertion detecting jig 33. The operator then can check whether any of the lamps has burned out by confirming whether all the LEDS 32, 48 are on at this time. Thus, the operator can identify an abnormality of the lamps themselves prior to the operation. It should be noted that the light emitters at the rear surfaces of the product number switches 133 of the product number switching board 36 (see FIG. 9) are all off.

The operator, in Step S04 of FIG. 14, then looks at the number tickets in the holders 132 of the product switching board 36 in FIG. 9 to determine whether the product number of the subassembly to be formed is registered. More particularly, the product number is already registered if it is listed, and is not registered yet if it is not listed. Even if the product number switch 133 is pushed at this stage, the light emitter will not be turned on if the corresponding product number is not registered yet. Based on this, the operator can easily confirm that the product number is not registered yet. In such a case, this product number is registered in accordance with the data registering process described later in Step S03 of FIG. 14.

The operator then selects a desired product number from the product numbers registered in Step S03 or judged in Step S02 to be registered already. The selection is carried out by pushing a corresponding product number switch 133 provided at the left side of the holders 132 of the product number switching board 36, while looking at the product number list defined by the product numbers written on the number tickets in the holder 132. Then, the light emitter at the rear surface of the pushed product number switch 133 emits a light to illuminate this product number switch, and a program in the memory Mr corresponding to this product number is selected.

The CPU 43 judges in Step S05 of FIG.14 whether the probes 41 to be used for the selected product number are proper. In the natural state (not contacted by the wire) of each probe 41 in the wire insertion-detecting jig 33, the spring bearing portion 65 of the plunger 61 is biased upward by the biasing member 63. Accordingly, the rod 62 below the plunger 61 also is held in its natural state with the spring bearing portion 73 of the rod 62 biased upward by the biasing member 74 to hold the rod 62 in contact with the contact element 75 at the same ground potential (low state) as the barrel 55. An abnormality of the probe 41 is identified if the level of a signal inputted to the CPU 43 via the detection signal input/output circuit 42, as shown in FIG. 2, is HIGH at this point. Thus, the guiding LED 48 that corresponds to the abnormal probe 41 is turned on in Step S06 of FIG. 14, and the buzzer 49 is operated to give a warning to the operator. In this case, the operator repairs the probe 41 in accordance with a specified procedure such as a start inspection in Step S07 of FIG. 14.

After completion of the above-described initial process, the following A-end mounting process and B-end mounting process are performed successively for the first wire. More particularly, the CPU 43 controls the driving circuit 45 to blink the instructing LED 32 of the supplying channel 31a that accommodates the wire to be mounted first (n=1 in the block of Step S08 of FIG. 14) to form the subassembly of the selected product number. Simultaneously, the instructing LEDs 32 that correspond to the supplying channels 31a that accommodate all other kinds of wires to be used for this subassembly are turned on because a plurality of kinds of wires are normally used to form the subassembly of the selected product number. Then, a specified guiding LED 48 of the A-end side wire insertion-detecting jig 33 is turned on to identify the cavity Cab (see FIG. 4) of the connector Cn into which the first wire should be mounted is turned on.

The operator draws an A-end of a wire out through the upper opening 31b in the supplying channel 31a corresponding to the blinking instructing LED 32. The operator then brings this A-end of the wire toward the A-end side wire insertion-detecting jig 33, and, in Step S09, inserts the A-end of the wire into the cavity Cab of the connector Cn that corresponds to the turned-on guiding LED 48.

The A-end of the wire then contacts and pushes down the leading end head 66 of the probe 41, as shown in FIGS. 4 and 5A. Forces exerted by the wire urge the plunger 61 down in the barrel 55 against the force of the biasing member 63, and the bottom end 61*a* of the plunger 61 contacts and pushes down the spring bearing portion 73 of the rod 62. The rod 62 moves down in the barrel 55 against the force of the biasing member 74, and thus the rod 62 and the contact element 75 separate to cancel the electrical connection between the rod 62 and the barrel 55. The bottom end of the rod 62 of the probe 41 is connected to a power supply of, e.g. 5 volts via the lead wire 78 and the pull-up resistor 79. Hence the electrical disconnection of the rod 61 from the barrel 55 changes the voltage level of the rod 62 from LOW to HIGH. The voltage change is sent to the CPU 43 via the detection signal input/output circuit 42, and the CPU 43 detects that the A-end of the wire is in the cavity Cab of the connector Cn corresponding to the probe 41 whose voltage level has risen to HIGH (second potential) (Step S10 of FIG. 15).

Figure 15:
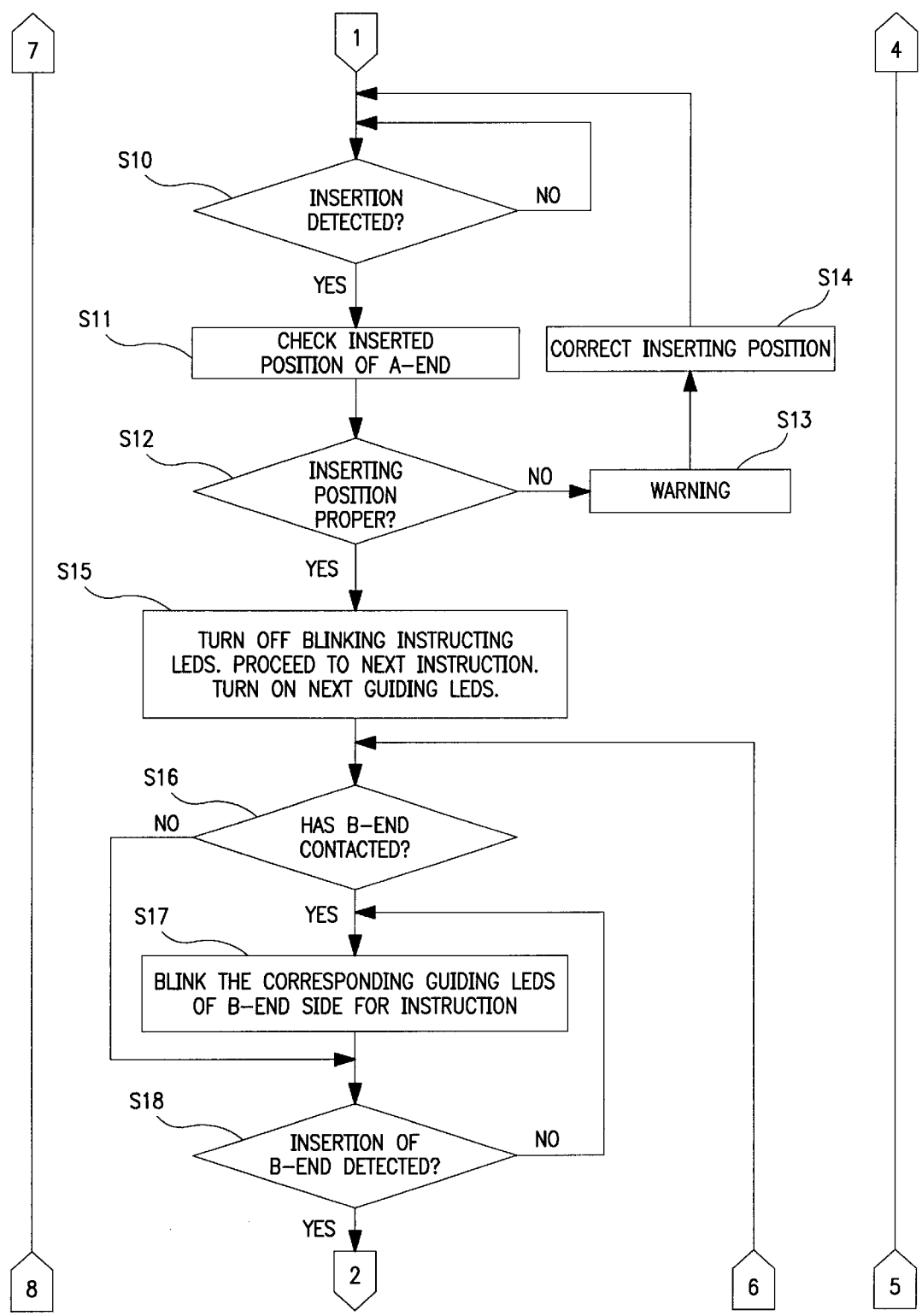

The CPU 43 checks the inserted position of the A-end of the wire based on the information already registered in the memory Mr in Steps S11 and S12 of FIG. 15. Specifically, the CPU 43 determines that the inserted position of the A-end is wrong if the voltage level has risen for a probe 41 different from the expected probe 41. In response to such a determination, the CPU 43 sends the driving circuit 46 a signal that causes the buzzer 49 to emit short intermittent buzzing sounds, thereby warning the operator that the inserted position of the A-end is wrong. The operator corrects the inserted position of the A-end in response to such a warning in Step S14 of FIG. 15, and carries out the operations after Step S10 again.

On the other hand, if the CPU 43 determines that the inserted position of the A-end is proper, Step S15 of FIG. 15 follows, in which the CPU 43 sends specified signals to the driving circuits 44, 45 to turn off the blinking instructing LED 32 and the turned-on guiding LED 48. Further, the instructing LED 32 of the supplying channel 31*a* that has a wire to be inserted next is blinked in view of a possibility that the operator wants to mount an A-end of another wire without mounting the B-end of this wire next.

The insertion of the B-end of the wire may follow directly after the insertion of the A-end, and that part of the process is described next. More particularly, the A-end of the wire that was inserted into the proper connector Cn contacts the probe 41. Accordingly, the rod 62 and the plunger 61 of the probe 41 are disconnected from the grounded barrel 55. Power is applied to the rods 62 and the plungers 61 via the pull-up resistor 79 as shown in FIG. 2. Thus, the voltage levels of the rods 62 of the respective probes 41 are held at HIGH, and the HIGH voltage levels of the rods 62 are inputted to the CPU 43 via the detection signal input/output circuit 42. The probes 41 in the B-end side wire insertion-detecting jig 33 are not contacted by a wire, and thus are held in their natural state. Consequently, as shown in FIG. 5A, the spring bearing portions 65 of the plungers 61 are biased upward by the biasing members 63 and hold the rods 62 in their natural state. Therefore, the spring bearing portions 73 of the rods 62 are biased upward by the biasing members 74 and bring the rods 62 into contact with the conductive contact elements 75 to hold them at the same ground potential (LOW) as the barrel 55.

In this state, the operator arbitrarily selects the wire having its A-end mounted in the connector, and brings the B-end of the selected wire into contact with the touch plate 81 shown in FIGS. 3 and 4. The touch plate 81 is grounded via the ground lead wire 57 as shown in FIG. 4. Therefore the voltage level of the wire that contacts the touch plate 81 falls to LOW. Then, the voltage level of the plunger 61 in contact with the A-end of the wire and the voltage level of the rod 62 in contact with the plunger 61 both fall to LOW (see FIGS. 4 and 5A).

The CPU 43 detects the contact of the B-end of the wire with the touch plate 81 based on the voltage change in the probe 41 in the A-end side wire insertion-detecting jig 33 (Step S16 of FIG. 15). The CPU 43 thus confirms the operator's arbitrary intention to mount the B-end of the wire and specifies the wire to be mounted.

The CPU 43 signals the driving circuit 44 to blink the guiding LED 48 that corresponds to the proper inserted position of the B-end of the wire in the Bend side wire insertion detecting jig 33 in Step S17 of FIG. 15. This guiding LED 48 continues to be blinked even after the operator disengages the B-end of the wire from the touch plate 81. Specifically, the wire is no longer grounded if the operator disengages the B-end of the wire from the touch plate 81. Therefore, the voltage level of the rod 62 of the probe 41 in contact with the A-end of the wire returns again to HIGH, and the CPU 43 detects this voltage level. However, the one guiding LED 48 of the B-end side wire insertion-detecting jig 33 continues to be blinked via the driving circuit 44. Simultaneously, the guiding LED 48 of the A-end side wire insertion detecting jig 33 corresponding to the A-end of the second wire to be mounted is left on.

The operator looks at the blinking guiding LED 48 of the B-end side wire insertion-detecting jig 33 and inserts the B-end of the wire into the corresponding cavity Cab of the connector Cn. The B-end of the wire contacts and pushes down the plunger 61 of the probe 41, and the plunger 61 of the probe 41 pushes the rod 62 out of electrical connection with the barrel 55. As a result, the voltage level of the rod 62 of the probe 41 rises from its initial state, and changes from LOW to HIGH. The voltage change in the rod 62 is sent to the CPU 43 via the detection signal input/output circuit 42, and the CPU 43 detects that the B-end of the wire has been inserted into the cavity Cab of the connector Cn corresponding to the position of the probe 41 whose voltage level had risen to HIGH (Step S18 of FIG. 15).

Figure 16:
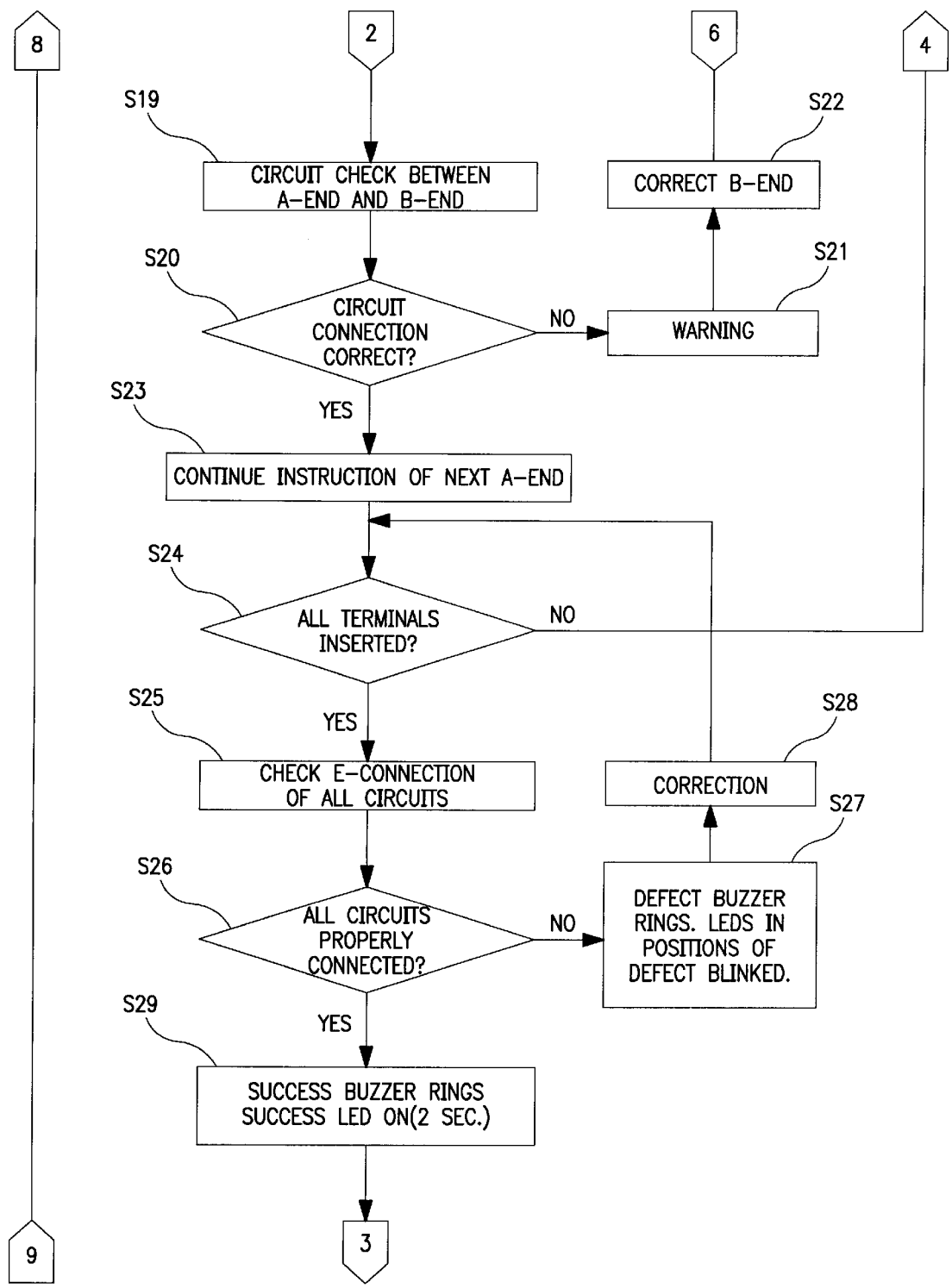

Correspondence between the probes 41 that detected the insertion of the wire ends in the A-end side and B-end side wire insertion-detecting jigs 33 is checked in Steps S19 and S20 of FIG. 16. If the probe 41 with the HIGH voltage level is different from the one expected by the CPU 43, then the CPU 43 determines that the B-end of the wire has been inserted in a wrong position. Accordingly, the CPU 43 signals the driving circuit 46 to cause the buzzer 49 to emit short intermittent buzzing sounds, thereby warning the operator of an error insertion of the B-end (Step S21 of FIG. 16). The operator then corrects the inserted position of the B-end (Step S22 of FIG. 16).

On the other hand, if the CPU 43 judges that the B-end has been inserted in a proper position, it sends a signal to the driving circuits 44, 45 to turn off the blinking instructing LED 32 and the guiding LED 48 corresponding to the mounted wire.

The above-described guiding and testing operations also are performed when the operator forgets to bring the B-end into contact with the touch plate 81, and an automatic electrical connection testing process follows if the B-end is properly inserted in this case.

The above-described A-end and B-end mounting processes are repeated for each wire to be inserted. Specifically, the CPU 43 guides the operator to mount the A-end of the second wire into the connector Cn by blinking the instructing LED 32 of the supplying channel 31*a* that accommodates the second wire and by turning on the guiding LED 48 that corresponds to the cavity Cab of the connector Cn in the A-end side wire insertion detecting jig 33 (Step S23 of FIG. 16). Similar to the mounting of the first wire, the operator inserts the A-end of the second wire into the proper cavity Cab of the connector Cn in accordance with the blinking instructing LED 32 and the turned-on guiding LED 48. Then, these instructing LED 32 and the guiding LED 48 are turned off. Thereafter, similar to the mounting of the first wire, the B-end mounting process is performed for the second wire.

The third and subsequent wires are mounted in a similar manner, and the operations of Steps S09 to S23 are repeated until the A-ends and B-ends of the wires are mounted into all the cavities Cab of one connector Cn in each wire insertion detecting jigs 33 (Step S24 of FIG. 16).

A subassembly can be completed by repeating the A-end mounting process and the B-end mounting process for each wire. However, the B-end mounting process is not started unless the operator brings the B-end into contact with the touch plate 81. Instead, the operator may take another wire corresponding to the blinking instructing LED 32 from the supplying channel 31*a* and insert it into the cavity Cab of the connector Cn corresponding to the turned-on guiding LED 48. In such a case, the CPU 43 forcibly returns to the operations of Step S10 and subsequent Steps instead of the operations of Step S16 and subsequent Steps, thereby enabling selection of mounting of the A-end of another wire. Accordingly, all B-ends may be mounted after the A-ends of all the wires are mounted as in a case where the apparatuses according to the first and second prior art are used in combination such as a case where a plurality of wires are inserted through a specified tube, or conversely the A-end and B-end of a next wire are mounted into the connectors after the A-end and B-end of one wire are mounted, i.e. each wire is completely mounted into the connectors before a next wire is mounted. Therefore, there is an advantage that the operator can freely select the operation sequence of the mounting processes.

The CPU 43 carries out an electrical connection test between the A-ends and the B-ends of the wires mounted in the connectors Cn in the A-end side and B-end side wire insertion-detecting jigs 33 (Steps S25, S26 of FIG. 16). At the start of this electrical connection test, the A-ends and B-ends of the respective wires are in contact with the probes in the connectors Cn and are electrically disconnected from the grounded barrels 55 (see FIGS. 4 and 5A).

At this stage, the CPU 43 controls the detection signal input/output circuit 42 connected with the rods 62 of the respective probes 41, for example, in the A-end side wire insertion-detecting jig 33 to lower the voltage levels of the rods 62 electrically connected with the A-ends of the wires one by one to the ground level. Then, the CPU 43 confirms the voltage levels of the rods 62 of the respective probes 41 in the B-end side wire insertion-detecting jig 33 via the detection signal input/output circuit 42 and checks whether the voltage level of the rod 62 of the B-end side probe 41 has fallen from HIGH to LOW in conformance with the wire whose voltage level is reduced from HIGH to LOW at the A-end side. This confirmation test is conducted at a specified time lag or period for all the wires mounted into the connector Cn.

If a failure is detected in the test of Step S26, the buzzer 49 repeatedly emits short intermittent buzzing sounds and the guiding LEDs 48 corresponding to the inserted positions of the A-end and B-end of the wire that caused the failure are blinked. The operator then performs a specified repair in Step S28.

The mounting of the wires into the connectors Cn is instructed, guided and tested properly in the aforementioned A-end mounting and B-end mounting processes. Consequently, there is no likelihood of failing to pass the test if the operations have been performed as instructed and guided. Thus, this electrical connection testing process provides a meaningful final electrical connection confirmation.

On the other hand, upon passing the test, the CPU 43 controls the driving circuit 46 to cause the buzzer 49 to emit a single long buzzing sound and the success lamp (success LED) 99 on the front surface of the control unit 34 is turned on for only 2 seconds in Step S29.

Figure 17:
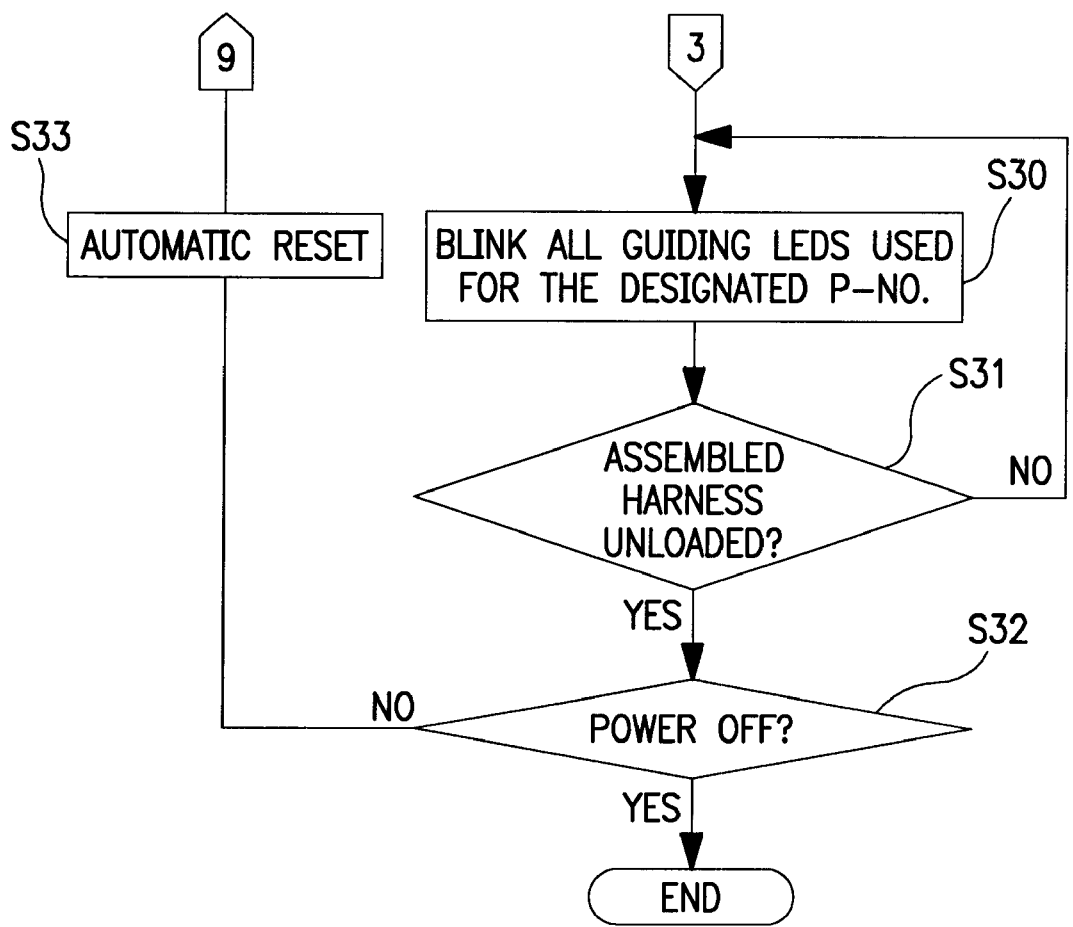
Figure 18:
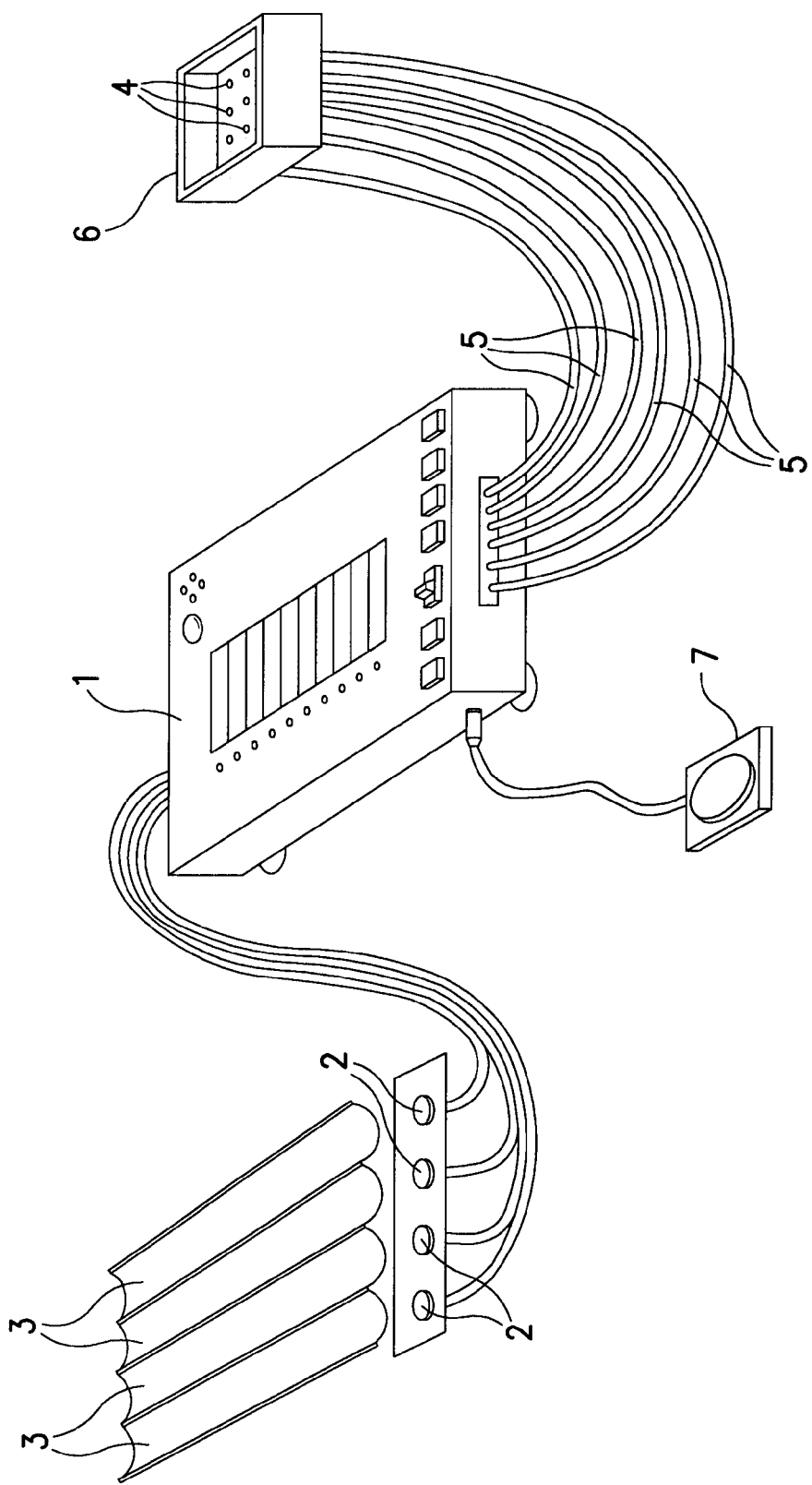
FIG. 18 is a diagram showing a wire mount instructing/testing apparatus according to first prior art.
Figure 19:
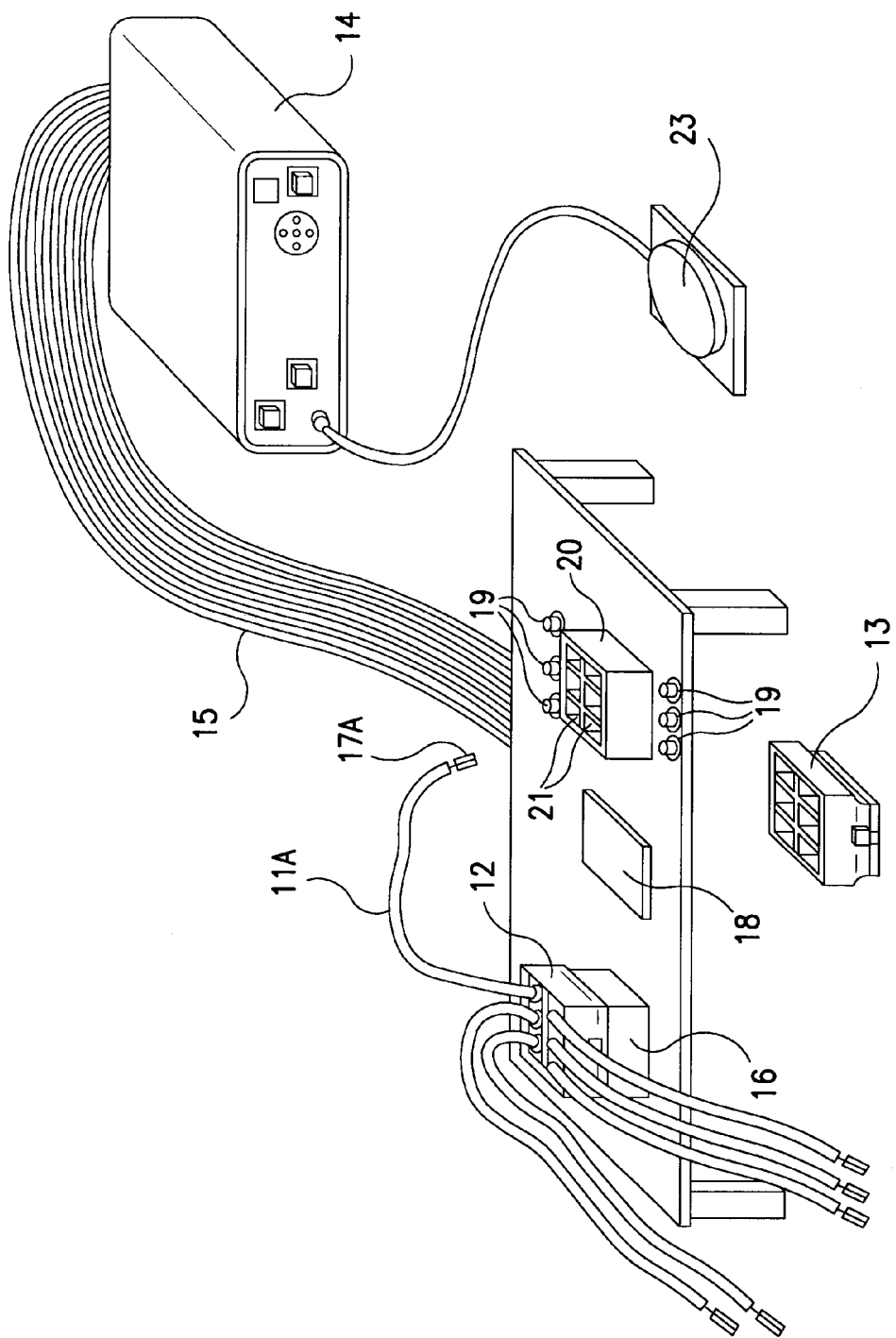
FIG. 19 is a diagram showing a wire mount instructing/testing apparatus according to second prior art.

Next, the wire-mounted and tested connectors Cn are detached from the respective wire insertion-detecting jigs 33. In particular, all guiding LEDs 48 of the wire insertion-detecting jigs 33 used for the designated product number are blinked in Step S30 of FIG. 17. After seeing this, the operator detaches the connectors Cn from the wire insertion detecting jigs 33. The ends of all wires then are detached from the probes 41, and the plungers 61 and the rods 62 (see FIG. 5A) of the probes 41 are brought into their natural states, i.e. the voltage levels thereof fall to ground level (LOW). Upon detecting the voltage change, CPU 43 determines whether the main power switch 90 is off (Step S32 of FIG. 17). Unless the main power switch 90 is off, the operation routine is automatically reset (Steps S33 of FIG. 14) since there is a high possibility that the operator continues the wire mounting operation for a next subassembly. This routine returns to Step S08 of FIG. 14 to repeat the operations in Step S08 and subsequent Steps.

If manual testing is desired during the above operation, the pedal switch (not shown) connected with the pedal connecting terminal 100 of FIG. 6 is pressed, for example, for 10 seconds or longer to set the manual testing mode. The automatic testing mode and the manual testing mode are switched alternately every time the pedal switch is pressed e.g. for 10 seconds or longer. Accordingly, if the operator intends to perform a specified process including the manual inserting operation, a suitable mode can be designated by an automatic/manual testing mode-designating means. This function preferably is maintained even if the power is turned off.

The operation of the data registering process is described with reference to Step S03 of FIG. 14. In particular, data registration may be started from the A-end side or from the B-end side, but is divided basically into a process of obtaining information on the connection between the A-end side and the B-end side and a process of saving an operation procedure for mounting the A-ends by successively pushing the respective probes 41 of the A-end side. Here, such a data registering method is performed, as an example, that the latter process is performed after the former process.

First, the operation mode is switched to the data registration mode by pressing the mode switch 91 provided on the front surface of the control unit 34 shown in FIG. 6 e.g. for 2 seconds.

At this stage, the CPU 43 drives the driving circuits 44, 45 to turn off all instructing LEDs 32 and all guiding LEDs 48, and hence to notify the operator that the data registration mode is set. Preferably, the mode switch 91 is transparent and can be illuminated by causing a light emitter at its rear surface to emit a light as an indication that the data registration mode is set.

The data of the B-ends are inputted (extraction teaching). Specifically, the mode switch 91 is pressed e.g. for 2 seconds. Then, all instructing LEDs 32 and all the guiding LEDs 48 are turned off, and the light emitter on the rear surface of the mode switch 91 is turned on.

The operator pushes the product number switch 133 of the product number switching board 36 corresponding the product number whose data are to be registered. Then, the operator mounts the A-end side connector 141 and the B-end side connector 142 of the model harness as a completed subassembly as shown in FIG. 12 into the wire insertion-detecting jigs 33 with which he wants to correspond the connectors.

The wire mount instructing/testing apparatus detects electrical connections between the respective A-ends and the B-ends to obtain information on the wires in the B-end side connector (teaching). The detection of the electrical connections between the A-end side and the B-end side may be carried out by a method similar to the testing process described above. The operator then pushes the save switch on the front surface of the control unit 34 shown in FIG. 6, and the CPU 43 saves the registered information for the connected wires in the memory Mr.

Data registration information concerning the correspondence between the A-ends and the B-ends of the subassembly can be saved automatically in the memory Mr merely by pushing the save switch 96 after the prepared model harness is mounted in the wire insertion detecting jigs 33. Therefore, the data can be registered by a very simple operation.

The CPU 43 then preferably automatically returns to the operation mode.

The operation procedure for the mounting of the A-ends in the A-end side wire insertion-detecting jig is saved as described below. In particular, the operator first pushes the product number switch 133 of the product number switching board 36 that corresponds to the product number whose data are to be registered. The operator then designates the wire that is to be mounted first while pushing the feed switch 93 on the front surface of the control unit 34 shown in FIG. 6. At this time, the instructing LEDs 32 are blinked successively while the feed switch 93 is pushed or every time it is pushed. The operator maintains the blinking state of the instructing LED 32 corresponding to the wire that will be mounted at its blinking state while looking at the successive blinking.

The operator pulls the wire out through the upper opening 31b in the supplying channel 31a that corresponds to the blinking instructing LED 32, and inserts the A-end of that wire to press the wire against the probe 41 in the cavity Cab of the connector Cn in the wire insertion-detecting jig 33.

At this stage, the blinking instructing LED 32 is turned on and the guiding LED 48 corresponding to the probe 41 pushed by the A-end is turned on. The operator then pushes the save switch 96, and the CPU 43 saves the registered information on the connected wire in the memory Mr.

Thereafter, the mode switch 91 is pushed again e.g. for 2 to complete the data input for the A-end, and the instructing/testing apparatus returns to the operation mode. At this time, the light emitter on the rear surface of the mode switch 91 is turned off.

Correct operations are successively registered as data in the above procedure for the respective supplying channels 31a in an order determined based on the actual operations. Accordingly, the data can be registered by a very simple method, and anybody can easily carry out data registration.

Further, since the operation procedure during the data registration is the same as the one during the actual operation (of instructing and guiding insertion), there is an advantage that the operator can easily recognize the operation procedure at the same time he carries out the data registration.

Similarly, the same operations are performed for the second and subsequent wires and, consequently, the A-ends of the all the wires used in the subassembly are connected with one connector.

If the operator tries to register an A-end, which is not connected with this connector, the data registration does not proceed any further and the buzzer 49 emits a warning.

The terminals of the model harness which have not been registered as A-ends are all processed as B-ends in the control unit 34.

By employing the above method, anybody can easily register all pieces of information on the A-ends and B-ends of the subassembly in a very simple data registration procedure.

Correcting the information thus registered may be done by pushing the change switch 94 on the front surface of the control unit 34 shown in FIG. 6.

In the processes described above, many wires can be assembled, but all wires cannot be assembled in one wire mount instructing/testing apparatus. However, the number of wires to be handled can be increased by using a plurality of wire mount instructing/testing apparatuses 34A, 34B connected in series as shown in FIG. 11. In such a case, a success signal representing successes in all tests on the wire mount is outputted from the success output terminal 106 at the rear surface of the control unit 34. One of the two success output terminals 106 on the control unit 34A of one wire mount instructing/testing apparatus is connected to one connection pin 103a of the probe interface port 103 of another wire mount instructing/testing apparatus while the other is connected to the grounding terminal 108 of the other wire mount instructing/testing apparatus. An output that represents the positive results in all tests conducted in the plurality of wire mount instructing/testing apparatuses can be outputted by taking a logic multiplication of the successes in all tests in the first apparatus and the successes in all tests in the second apparatus and outputting such a logic multiplication from the final wire mount instructing/testing apparatus. With such an arrangement, if the probe interface port 103 contains, for example, 60 connection pins, one of the 60 connection pins of the probe interface port 103 of the second or succeeding wire mount instructing/testing apparatus is used for the apparatus-to-apparatus connection, but the remaining 59 pins can be used for the tests.

What is claimed is:

1. A wire mount control apparatus for controlling a mounting of wires in at least first and second connectors, each said connector being formed with a plurality of insertion holes, said apparatus comprising:

a plurality of wire supplying means for supplying wires, each said wire having opposite first and second ends, at least first and second wire insertion-detecting jigs for accommodating the first and second connectors respectively, each said wire insertion-detecting jig comprising an accommodation portion having an open end into which one of said connectors is mountable, probes provided partly in the accommodation portion, each said probe having a conductive barrel and a non-conductive plunger slideably mounted in the barrel and projecting into the accommodation portion, the plungers corresponding respectively to the insertion holes of the connectors, and being biased toward the open end of the accommodation portion, each said probe further having a conductive rod biased into electrical contact with the conductive barrel for holding the probe at a first potential, the plunger being configured for displacement in response to insertion of the wire into the insertion hole, and the displacement of the plunger moving the conductive rod out of engagement with the conductive barrel such that the probe is switched to a second potential different from the first potential, guiding indicators provided in one-on-one correspondence with the probes for indicating the insertion hole of the connector for the selected wire, and control means comprising:

a first indicating section for indicating one of said wire supplying means from which one said wire should be taken in accordance with an assembling order based on information registered in a storage means and for indicating a proper single insertion hole of the first connector for receiving the first end of the selected wire by controlling the guiding indicator corresponding to the proper insertion hole, a second indicating section for detecting the wire that has the first end mounted in the first connector and indicating a proper one of said insertion holes of said second connector for receiving the second end of the selected wire, said indicating being carried out by controlling the guiding indicator corresponding to the proper insertion hole based on the detecting result and information in the storage means.

2. The wire mount control apparatus according to claim 1, wherein the wire insertion detection jig comprises a touch plate held at the first potential, so that the end of the wire being brought into contact with the touch plate.

3. The wire mount control apparatus according to claim 1, wherein the first instructing section includes means for determining that the first end of each wire has been properly mounted when a voltage level of a specified one of the probes at the first wire insertion-detecting jig is switched from the first potential to the second potential.

4. The wire mount control apparatus according to claim 3, wherein the second instructing section includes means for determining that the second end of each wire has been properly mounted when a voltage level of a specified one of the probes located at the second wire insertion-detecting jig is switched from the first potential to the second potential.

5. The wire mount control apparatus according to claim 4, wherein the control means further comprises an electrical connection testing section for testing an electrical connection between the first and second connectors by detecting potential changes in the probes of the first and second wire insertion-detecting jigs by successively switching the potentials of the respective probes in one of said wire insertion detecting jigs from the first potential to the second potential after the first and second indicating sections have determined that all of the wires have been properly mounted.

6. The wire mount controlling apparatus according to claim 5, further comprising a sound output means for notifying a success in tests by a first specified sound if the first indicating section determines that the first end of each wire has been properly mounted, the second indicating section determines that the second end of each wire has been properly mounted and the electrical connection testing section detects the proper electrical connection based on an information in the storage means, the sound output means notifying a failure in tests by a second specified sound if the first indicating section determines that the first end of each wire has not been properly mounted, the second indicating section determines that the second end of each wire has not been properly mounted or the electrical connection testing section does not detect the proper electrical connection based on the information in the storage means.

7. A wire mount control apparatus for controlling a mounting of wires in at least first and second connectors, each said connector being formed with a plurality of insertion holes, said apparatus comprising:

a plurality of wire supplying means for supplying wires, each said wire having opposite first and second ends;

at least first and second wire insertion-detecting jigs for accommodating the first and second connectors respectively, each said wire insertion-detecting jig comprising an accommodation portion into which one of said connectors is mountable, probes provided partly in the accommodation portion and corresponding respectively to the insertion holes of the connector, the probes being held at a first potential when no wire is in the corresponding insertion hole and being switched to a second potential different from the first potential when an end of one said wire is inserted into the corresponding insertion hole to contact the probe, guiding indicators provided in one-on-one correspondence with the probes for indicating the insertion hole of the connector for the selected wire; and control means comprising:

a first indicating section for indicating one of said wire supplying means from which one said wire should be taken in accordance with an assembling order based on information registered in a storage means, and for indicating a proper single insertion hole of the first connector for receiving the first end of the selected wire by controlling the guiding indicator corresponding to the proper insertion hole, a second indicating section for detecting the wire that has the first end mounted in the first connector and indicating a proper one of said insertion holes of said second connector for receiving the second end of the selected wire, said indicating being carried out by controlling the guiding indicator corresponding to the proper insertion hole based on the detecting result and information in the storage means, wherein the second indicating section includes a touch plate held at the first potential and identifies the wire chosen based on a change in voltage level of the probe in the first connector from the second potential to the first potential caused by contact between the second end of the wire and the touch plate.

8. The wire mount controlling apparatus for controlling a mounting of wires in at least first and second connectors, each said connector being formed with a plurality of insertion holes, said apparatus comprising:

a plurality of wire supplying means for supplying wires, each said wire having opposite first and second ends;

at least first and second wire insertion-detecting jigs for accommodating the first and second connectors respectively, each said wire insertion-detecting jig comprising an accommodation portion into which one of said connectors is mountable, probes provided partly in the accommodation portion and corresponding respectively to the insertion holes of the connector, the probes being held at a first potential when no wire is in the corresponding insertion hole and being switched to a second potential different from the first potential when an end of one said wire is inserted into the corresponding insertion hole to contact the probe, guiding indicators provided in one-on-one correspondence with the probes for indicating the insertion hole of the connector for the selected wire; and control means comprising:
- a first indicating section for indicating one of said wire supplying means from which one said wire should be taken in accordance with an assembling order based on information registered in a storage means, and for indicating a proper single insertion hole of the first connector for receiving the first end of the selected wire by controlling the guiding indicator corresponding to the proper insertion hole,
- a second indicating section for detecting the wire that has the first end mounted in the first connector and indicating a proper one of said insertion holes of said second connector for receiving the second end of the selected wire, said indicating being carried out by controlling the guiding indicator corresponding to the proper insertion hole based on the detecting result and information in the storage means,
- a combination selecting/designating means for selecting and designating one of a plurality of combinations of wire mount positions for each connector, and
- a data registering unit for registering data on the plurality of combinations of the wire mount positions for each connector.

9. A wire mount controlling apparatus according to claim 8, wherein the control means identifies a wire supplying means from which a wire should be taken by blinking one of the instructing indicators based on the information in the storage means if the operation of the first indicating section starts with none of the probes contacted by the wires, and turns on the instructing indicators corresponding to the wire supplying means that supply the wires to be mounted into the first connector later based on the selected and designated content of the selecting/designating means and the information in the storage means.

10. A wire mount control apparatus for controlling a mounting of wires in at least first and second connectors, each said connector being formed with a plurality of insertion holes, said apparatus comprising:
- a plurality of wire supplying means for supplying wires, each said wire having opposite first and second ends;
- at least first and second wire insertion-detecting jigs for accommodating the first and second connectors respectively, each said wire insertion-detecting jig comprising an accommodation portion into which one of said connectors is mountable, probes provided partly in the accommodation portion and corresponding respectively to the insertion holes of the connector, the probes being held at a first potential when no wire is in the corresponding insertion hole and being switched to a second potential different from the first potential when an end of one said wire is inserted into the corresponding insertion hole to contact the probe, guiding indicators provided in one-on-one correspondence with the probes for indicating the insertion hole of the connector for the selected wire, a touch plate exposed on an outer surface of the wire insertion detection jig for contact with the end of the wire, the touch plate being at the first potential; and control means comprising:
- a first indicating section for indicating one of said wire supplying means in accordance with an assembling order based on information registered in a storage means, and for indicating a proper single insertion hole of the first connector for receiving the first end of the selected wire by controlling the guiding indicator corresponding to the proper insertion hole,
- a second indicating section for detecting the wire that has the first end mounted in the first connector and indicating a proper one of said insertion holes of said second connector for receiving the second end of the selected wire, said indicating being carried out by controlling the guiding indicator corresponding to the proper insertion hole based on the detecting result and information in the storage means,
- the second indicating section of the control means is operative to determine that the second end of each wire has been properly mounted when a voltage level of the probe located at the correct single insertion hole of the other connector is switched from the first potential to the second potential without the other end of each wire being brought into contact with the touch plate,
- at least one success output terminal for outputting a success signal if all the wires have been properly mounted in the connectors in the wire insertion detecting jigs, and wherein the control means is constructed to receive a success signal sent from a success output terminal of another wire mount control apparatus and, in such a case, outputs the success signal from the success output terminal thereof only when all the wires relating to the control means have been properly mounted and the success signal is inputted from other wire mount control apparatus.

11. A wire mount control apparatus according to claim 10, wherein the control means comprises:
- means for setting a data registration mode for registering an assembling order of the respective wires and a correspondence between the ends of the respective wires based on a specified operation,
- means, operative when with the data registration mode is set, for registering sequences of a turned-on state and a blinking state of the respective instructing indicators and the respective guiding indicators and a sequence of bringing the first ends of the plurality wires into contact with the respective probes when the operator brings the first ends of the respective wires into contact with the respective probes in the first wire insertion-detecting jig in a sequence employed in an actual operation while corresponding the turning-on and blinking of the respective instructing indicators and the respective guiding indicators, and
- means, operative when connectors of a specified model harness completed with the data registration mode set, for extracting a correspondence in connection of the opposite ends of the respective wires mounted in the connectors and saving it in the storage means.

* * * * *